(12) United States Patent
Kita et al.

(10) Patent No.: US 6,903,506 B2
(45) Date of Patent: Jun. 7, 2005

(54) ORGANIC ELECTROLUMINESCENT ELEMENT, DISPLAYING APPARATUS, LIGHT EMITTING METHOD, DISPLAYING METHOD AND TRANSPARENT SUBSTRATE

(75) Inventors: Hiroshi Kita, Tokyo (JP); Tomohiro Oshiyama, Tokyo (JP)

(73) Assignee: Konica Corporation, Tokyo (JP)

( * ) Notice: Subject to any disclaimer, the term of this patent is extended or adjusted under 35 U.S.C. 154(b) by 17 days.

(21) Appl. No.: 10/105,893

(22) Filed: Mar. 25, 2002

(65) Prior Publication Data

US 2002/0175619 A1 Nov. 28, 2002

(30) Foreign Application Priority Data

Mar. 27, 2001 (JP) ........................................ 2001-090012
May 28, 2001 (JP) ........................................ 2001-158551

(51) Int. Cl.[7] ................................ H01J 1/62; H01J 5/16
(52) U.S. Cl. ........................ 313/506; 313/504; 313/112
(58) Field of Search ............................... 313/504, 506, 313/507, 509, 110, 112, 113

(56) References Cited

U.S. PATENT DOCUMENTS

| 5,986,400 | A | * | 11/1999 | Staring et al. | ............... 313/503 |
|---|---|---|---|---|---|
| 6,091,195 | A | * | 7/2000 | Forrest et al. | ............... 313/504 |
| 6,140,764 | A | * | 10/2000 | Xu et al. | ..................... 313/504 |
| 6,469,438 | B2 | * | 10/2002 | Fukuoka et al. | ............. 313/504 |
| 2001/0028962 | A1 | * | 10/2001 | Hirai | ........................... 428/690 |
| 2001/0031365 | A1 | * | 10/2001 | Anderson et al. | ........... 428/432 |

FOREIGN PATENT DOCUMENTS

| JP | 03-152897 | 6/1991 | |
| JP | 06-283271 | 10/1994 | |
| JP | 07-282981 | 10/1995 | |
| JP | 08279394 A | * 10/1996 | ........... H05B/33/14 |
| JP | 09-180883 | 7/1997 | |
| JP | 2000-098931 | 4/2000 | |

* cited by examiner

*Primary Examiner*—Vip Patel
*Assistant Examiner*—German Colón
(74) *Attorney, Agent, or Firm*—Frishauf, Holtz, Goodman & Chick, P.C.

(57) ABSTRACT

An organic electroluminescent element is disclosed. The organic electroluminescent element has a micro optical resonator structures, an organic electroluminescent member emitting light within the color region of bluish purple and a color conversion member emitting visible fluorescent by absorbing the light emitted from the organic light emitting member.

25 Claims, 4 Drawing Sheets

ORGANIC ELECTROLUMINESCENT ELEMENT, DISPLAYING APPARATUS, LIGHT EMITTING METHOD, DISPLAYING METHOD AND TRANSPARENT SUBSTRATE

FIELD OF THE INVENTION

The present invention relates to an organic electroluminescent element, hereinafter simply referred to as an organic element, a displaying apparatus, a light emitting method, a displaying method and a transparent substrate.

BACKGROUND OF THE INVENTION

An inorganic electroluminescent element has been used as a flat type light source. An alternative high voltage is required to drive such the inorganic electroluminescent element.

A recently developed organic EL element is an element has a structure in which an organic compound thin layer containing an organic fluorescent compound is arranged between a cathode and an anode. The EL element emits light, fluorescence or phosphorescence, when the excitons formed by recombination of electrons and holes injected into the thin layer are deactivated. To utilize the emitted light, at least one of the electrodes each arranged at both sides of the organic compound thin layer is usually a transparent electrode such as ITO. The transparent electrode is supported by a transparent substrate such as a glass plate.

The organic EL element is noted from the viewpoint of the portability and space saving since the element can emit light at a low voltage within the range of from several to several decade volts and has a wide viewing angle and a high visuality since the element emits light itself and is complete solid thin layer shaped element.

Various full color displaying apparatus and projecting apparatus each using the organic EL element have been proposed. Among them, Japanese Patent Publication Open to Public Inspection, hereinafter referred to as JP O.P.I., No. 3-152897 discloses a displaying apparatus to display a full color image by the use of an organic EL element composed of an organic compound thin layer containing a blue or blue-green light-emitting layer arranged between the electrodes on which two color conversion members and a blue color filter for raising the purity of blue light are provided. One of the color conversion members is a member emitting green fluorescent light and the other is a member emitting red fluorescent light by absorbing the blue of bluish green light emitted from the organic EL member. The displaying apparatus of such the system is superior at the point of easy production to an usual displaying apparatus in which three kinds of organic EL members each emitting blue, green and red light are separately coated. However, it is a problem that red light having a sufficient intensity is difficultly obtained through the color conversion member since the light emitted from the organic EL member is blue or blue-green.

Moreover, the light is largely lost when the light is conducted from the light emission member to the light conversion member since the light emitted from the light-emitting layer has no directivity and scatters in all directions. The light only emitted to the side of the color conversion member, the front direction, from the organic EL member is utilized, and the output coefficient of light to the front direction, the light emission coefficient, is defined by the refractive index n of the light-emitting layer since the light emission coefficient can be approximated by $\frac{1}{2}n^2$ according to the classical optics. The light emitting coefficient of the organic EL member is about 20% when the refractive index of the light-emitting layer is 1.7. The light other than the above is transported in the area direction of the light-emitting layer, the scatter in the side direction, or disappeared in the metal electrode facing to the transparent electrode through the light-emitting layer. Accordingly, the intensity of the light is made insufficient and the displayed image becomes too dark.

The foregoing problem of the low light emitting coefficient is a common problem should be solved in the apparatus using the organic EL element not only the apparatus disclosed in the above JP O.P.I. No. 3-152897.

The color purity of light emitted from the organic fluorescent compound contained in the light-emitting layer of the organic EL element is not always high since the half band width of the spectrum of the emitted is about 100 nm.

In such the situation, an organic EL element having a micro optical resonator structure is proposed as a method for solving the problems of the light emission coefficient and the color purity in JP O.P.I. Nos. 6-283271, 7-282981, 9-180883 and 2000-98931. In such the elements, a dielectric mirror is provided between the transparent electrode and the transparent substrate so that the light is intensified by the interference of light between the metal cathode as the light reflection mirror and the dielectric mirror when the light is emitted from the light-emitting layer placed between these mirrors. In the organic El element having the micro optical resonator structure, the thickness of the layer provided between the foregoing mirrors can be optionally designed so that the interference condition is satisfied at a desired wavelength of light or the emission light wavelength. Therefore, the intensity of the light at the designed wavelength is intensified and the content of the other wavelength is inhibited. Accordingly, the half band width of the emitted light spectrum is decreased and the color purity of the light can be raised. Furthermore, the pattern of light emission is become to strongly depend on the wavelength of the emitted light so that the light at the emission wavelength is considerably directed to front of the dielectric mirror and the loss in the side direction is decreased.

The light emission mechanism of the organic EL element having the micro optical resonator structure is described in "Control of Light Emission Characteristics of Organic EL Element", S. Tokitou, NHK Broadcasting Technological Laboratory, Reference material of lecture meeting, and "Device Structure and Light Emission Mechanism of Organic EL Element II", A. Fujii and K. Yoshino, Applied Physics, Vol. 69, No. 11, 2000.

However, a problem that the wide visible angle cannot be obtained because of the directivity of the emitted light is occurred when the organic EL element having the micro optical resonator structure is applied for the displaying apparatus. Therefore, the application for the projection apparatus has been proposed only. Furthermore, there is a problem on the color reproduction that the color of the emitted light is contained because of that the optical length of the system is varied depending on the viewing angle.

On the other hand, it is pointed out as the problem on the organic EL element that the low durability of the element caused by the low stability of the element against the moisture of air. In the present circumstances, a transparent glass with a low moisture permeability is used as the transparent substrate of the organic EL element and the element is formed on the substrate by a dry layer forming method such as a deposition method, moreover, the element is shielded by a cap of metal or glass. However, the cost of the element is raised because of the low productivity, and the element is difficultly applied to a portable apparatus such as a PDA since the element with no flexibility is easily broken and the weight thereof is large.

It is considered, therefore, to use a transparent resin film as the transparent substrate. However, a film of poly(ethylene terephthalate), poly(ethylene naphthalate) and cellulose triacetate cannot be used as the transparent substrate different from the glass plate since such the resin film has a high moisture permeability.

SUMMARY OF THE INVENTION

The object of the invention is to provide an organic EL element having a high light emitting efficiency, a wide visible angle and that without a color change depending on the viewing angle, a light emission method of such the element, a displaying apparatus and its displaying method and a transparent substrate having a suitability for the portable apparatus, a low moisture permeability and applicable to the organic EL element.

The invention and its embodiments are described below.

1. An organic electroluminescent element having a micro optical resonator structure, an organic electroluminescent member emitting light within the color region of bluish purple and a color conversion member emitting visible fluorescent by absorbing the light emitted from the organic light emitting member.

2. The organic electroluminescent element described in the foregoing 1, wherein the organic electroluminescent member is provided on the upper side of a transparent substrate and has a half mirror member, an organic compound layer containing a light-emitting layer and a light reflective member in this order from the transparent substrate.

3. The organic electroluminescent element described in the foregoing 2, wherein the half mirror has a dielectric mirror and a transparent electrode in this order from the transparent substrate.

4. The organic electroluminescent element described in the foregoing 2 or 3 wherein the light reflective member is a metal electrode.

5. The organic electroluminescent element described in the foregoing 3 or 4 wherein the color conversion member is provided under the dielectric mirror.

6. The organic electroluminescent element described in any one of the foregoing 3 through 5 wherein the dielectric mirror comprises a layer mainly comprising silicone oxide and a layer mainly comprising titanium oxide.

7. The organic electroluminescent element described in the foregoing 6 wherein at least one of the layer mainly comprising silicone oxide and the layer mainly comprising titanium oxide contains silicone oxonitride or titanium oxonitride.

8. The organic electroluminescent element described in any one of the foregoing 2 through 7 wherein the transparent substrate is a transparent resin film.

9. The organic electroluminescent element described in any one of the foregoing 1 through 8 wherein the color of the light emitted from the color conversion member is within the red region.

10. The organic electroluminescent element described in any one of the foregoing 1 through 8 wherein the color of the light emitted from the color conversion member is within the green region.

11. The organic electroluminescent element described in any one of the foregoing 1 through 8 wherein the color of the light emitted from the color conversion member is within the blue region.

12. A displaying apparatus having the organic electroluminescent element described in any one of the foregoing 1 through 11.

13. A displaying apparatus wherein a first organic electroluminescent element described in 9, a second organic electroluminescent element described in 10 and a third organic electroluminescent element described in 11 are arranged in a line on the same substrate.

14. A method for emitting light wherein visible fluorescent light is emitted from a color converting member by absorbing light within the bluish purple region emitted from an organic electroluminescent light emission member having a micro optical resonator structure.

The organic electroluminescent element described in the foregoing 2 through 9 can be applied this method for emitting light.

15. The method for emitting light described in the foregoing 14 wherein the color of the light emitted from the color conversion member is within the red region.

16. The method for emitting light described in the foregoing 14 wherein the color of the light emitted from the color conversion member is within the green region.

17. The method for emitting light described in the foregoing 14 wherein the color of the light emitted from the color conversion member is within the blue region.

18. A method for displaying wherein displaying is performed by the light emitted by the method described in any one of the foregoing 14 through 17.

19. A method for displaying wherein full color displaying is performed by the use of the light within the red region emitted by the method for emitting light described in the foregoing 15, the light within the green region emitted by the method for emitting light described in the foregoing 16 and the light within the blue region emitted by the method for emitting light described in the foregoing 17.

20. A transparent substrate of the organic electroluminescent element having a dielectric mirror structure.

21. The transparent substrate of the organic electroluminescent element described in the foregoing 20 wherein a dielectric mirror layer is provided on the upper side of the transparent substrate.

22. The transparent substrate of the organic electroluminescent element described in the foregoing 21 wherein the transparent substrate is a transparent resin film.

23. The dielectric mirror layer described in the foregoing 6 or 7 can be applied as the dielectric mirror.

24. A transparent substrate having a color conversion member provided between the transparent resin film and the dielectric mirror layer.

DETAIL DESCRIPTION OF THE INVENTION

Figure 1:
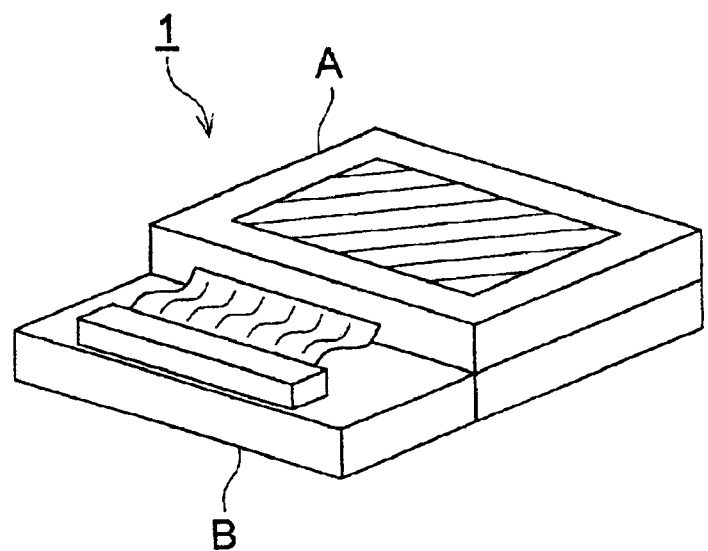
FIG. 1 shows a schematic drawing of an example of displaying apparatus comprising the organic EL element.

The present invention is described in detail below.

The light emitted from the organic electroluminescent member having the micro optical resonator gives an advantage that the light intensity is high. However, such the light raises problems that the visible angle is made narrow and the color of the light is changed depending on the viewing angle. The invention solves such the problems by combining the organic electroluminescent element with the color conversion member so that the light conversion member emits visible fluorescent light by absorbing the light emitted from the organic electroluminescent member.

The high intensity light emitted from the organic electroluminescent member is used as exciting energy for emitting light by the color conversion member. The light emitted from the fluorescent compound contained in the color conversion member has a wide visible angle since the light has no directivity and the color change is not occurred since the wavelength of the emitted light is the characteristics of the fluorescent compound.

The organic EL element according to the invention simultaneously solves the problem of low intensity of the light emitted by the organic EL element having the color conversion member and no micro optical resonator described in the foregoing JP O.P.I. No. 3-152897.

AS a result of that, the organic electroluminescent element, the displaying apparatus using the element, the light emitting method and the displaying method which are suitably applied to a displaying apparatus to be directly viewed can be provided.

Moreover, the intensity of red light emitted from the color conversion member can be more easily obtained by the organic EL element according to the invention emitting light of color within the bluish purple region compared with the use of the element described in the foregoing JP O.P.I. No. 3-152897 emitting light within the blue or bluish green region.

When an organic EL member comprised of the organic compound thin layer emitting light within the blue or bluish green region described in the foregoing JP O.P.I. No. 3-152897 and the micro optical resonator structure attached to the thin layer is applied to a BGR full color displaying apparatus, the light directly output from the organic EL member is used as the light of color of blue region B and the light emitted by the fluorescent material through the color conversion member is used as the light of color of green G or red R. Consequently, the light intensified by the micro optical resonator with a high directivity is directly used as the blue light B and the light which is intensified by the micro optical resonator with no directivity and converted through the color conversion member is used as the light of G and R. Accordingly, when the organic compound thin layer emitting light within the blue or bluish green region is applied to a full color displaying apparatus, a sufficient visuality, light intensity and color balance cannot be obtained, combined with the low intensity of emitted light in the red color region. Contrary to that, a superior displaying apparatus having a good BGR balance can be provided by the use of the organic EL member emitting light within the bluish purple region.

The transparent substrate according to the invention having the dielectric mirror can also be applied to various apparatus other than the organic EL element such as an electric engineering apparatus having a translucent reflective layer to improve the efficiency of light irradiated from the back light.

The micro optical resonator structure can be given to the organic EL member by the use of the transparent substrate according to the invention as the transparent substrate and the dielectric mirror. Moreover, it is found that the dielectric mirror structure gives a moistureproofness to the transparent substrate and raises the barrier property against a gas of the organic EL element as a whole.

When the transparent substrate of the invention is the transparent resin film having thereon the dielectric mirror layer, the substrate is suitable for the application to a portable apparatus such as a PDA since it is flexible, difficultly broken and light in the weight.

The elements according to the invention are described below.

The organic EL element according to the invention has the organic EL member with the micro optical resonator structure and the color converting member emitting visible light by absorbing the light emitted from the organic EL member.

There is no limitation on the relative position of the organic EL member to the color conversion member so far as the color conversion member is arranged so as to absorb the light emitted from the organic EL member. It is preferable that the color conversion member is provided in the direction of light emitted from the organic EL member.

In the organic EL member having the micro optical resonator, the light generated in the organic EL member is reflected in the organic EL member and interference is occurred by the difference of the refractive index of the layers constituting the organic EL member. The structure in which the light-emitting layer is arranged between a half mirror and a light reflecting member is preferable to occur the reflection and output the intensified light.

The structure of the half mirror can be roughly classified into two kinds.

One of them, the half mirror is constituted in a form of a thin layer-shaped electrode made of, for example, Au, Ag, Cu, Pt, Ni, Pd, Se, Te, Rh, Ir, Ge, Os, Ru, Cr, W, ITO, $SnO_2$ and $ZnO_2$ having a thickness so that the electrode layer has a light reflectance of not less than 30%, or in a form of a layer constituted by accumulating two or more of the thin layer-shaped electrode so that the layer has a reflectance of not less than 50% and a transparency of not less than 30%.

Another one is a layer constituted by accumulating the dielectric mirror and the transparent electrode on the transparent substrate in this order. The dielectric mirror is constituted by stacking plural layers each having a difference of the refractive index not less than 0.1 from each other. The dielectric mirror is also called as the stacked layer mirror.

A preferable constitution of the half mirror is a combination of the later dielectric mirror and the transparent electrode.

The light reflecting member may be constituted by a metal electrode which preferably has a light reflectance of not less than 80%.

When the organic EL element according to the invention has the structure in which the organic compound thin layer is arranged between the half mirror member and the light reflecting member to make the organic EL member with the micro optical resonator, the optical thickness of the organic compound thin layer and that of the half mirror should be controlled so as to satisfy the condition for existing a standing wave in the body of the element. Known method can be applied for controlling the optical thickness of the layer.

The controlling method is described in, for example, JP O.P.I. Nos. 6-283271, 7-282981 and 9-180883, Tokitou et al., J. Appl. Phys., Vol. 86, No.5, pp. 2407–2411, 1 Sep. 1999, Nakayama et al., Appl. Phys. Lett. 63(5), pp. 594–595, 2 Aug. 1993 and Takada et al., Appl. Phys. Lett. 63(15), pp.

2032–2034, 11 Oct. 1993. Any method described in the above can be applied in the invention.

The following Equation 1 is cited as an example of the controlling method. The effective intensifying of the intensity and sharpening of the spectrum of the emitted light are observed when the optical length L is become to 1.5 or 2 times of the objective wavelength of the emitted light.

The equation is as follows in which the light penetration into the stacked layer mirror or dielectric mirror is considered as to the optical length L of the micro optical resonator.

$$L = (\lambda/2) \times (n_{eff}/\Delta n) + \Sigma n_i d_i \cos \theta \qquad \text{Equation 1}$$

In the equation, $n_{eff}$ is the effective refractive index of the stacked layer mirror, $\Delta n$ is the difference of refractive indexes between the two layers of the stacked layer mirror, $n_i$ and $d_i$ are each the refractive index and the thickness, respectively, of the organic compound thin layer and the transparent electrically-conductive layer as the transparent electrode, and $\theta$ is an angle of incident line of the light to the normal line at the interface of the organic compound thin layers or that of the organic compound thin layer and the transparent electrically-conductive layer. Idealistically, the micro optical resonator structure with a high efficiency is made when the optical length L is 1.5 or 2 times of the wavelength of the objective emitted light. However, the object of the invention can be practically attained when the L is within the range of ±10% of the ideal optical length.

The first member of the equation $(\lambda/2)(n_{eff}/\Delta n)$ expresses the penetrating deepness of the resonating light into the stacked layer mirror. The first member of the equation shows that the penetration deepness is defined when the wavelength $\lambda$ is decided since the $n_{eff}$ and the $\Delta n$ are each a constant depending on the material constituting the stacked layer mirror. The refracting index $n_i$ of each layer in the second member of the equation is also a constant depending the material. The thickness of each of the layers of the stacked layer is set at $\lambda/4$. Accordingly, the optical length L can be controlled by varying the thickness di of the transparent electrically-conductive layer and the organic compound thin layer.

The wavelength of the light resonatable in the micro optical resonator is defined by the forgoing optical length L. Light, for which the optical length L corresponds to integer multisteps of ½ of the wavelength, can resonate with the micro optical resonator. Consequently, the wavelength of light released from the element by the resonance with the micro Optical resonator is shifted to the shorter wavelength side when the optical length L is reduced accompanied with decreasing of the total thickness of the transparent electrically-conductive layer and the organic compound thin layer. In such the case, light, for which the optical length L is equal to 1.5 times ½ of the wavelength, has the longest wavelength as resonating light. The light having a high directivity to the front side of the element can be obtained when the wavelength of the light released from the element is made shorter. Furthermore, the light emitting mode of the element can be made a single mode by reducing the optical length L.

The organic EL member having the micro optical resonator is provided on the upper side of the transparent substrate, and one is preferred in which the dielectric mirror, the transparent electrode, the organic compound thin layer containing the light-emitting layer and the metal electrode are provided in this order from the transparent substrate.

Examples of preferable layer constitution of the organic EL element according to the invention include:

a. Transparent substrate/Color conversion member/Dielectric mirror/Transparent electrode/Organic compound thin layer/Metal electrode b. Color conversion member/Transparent substrate/Dielectric mirror/Transparent electrode/Organic compound thin layer/Metal electrode.

The organic compound thin layer may be constituted by a single layer or a stacked layer. In the case of stacked layer, for example, a layer other than the organic substance, for example, a layer of an inorganic salt such as lithium fluoride and magnesium fluoride or a layer containing such the compound may be arranged at an optional position.

The electrodes (anode/cathode) and the organic compound thin layer are basically constituted so that at least one light-emitting layer is arranged between a pair of the electrodes and a hole transporting layer and an electron transportating layer are provided according to necessity. In the invention, it is preferable that one of the electrodes is the transparent electrode through which the light emitted from the light-emitting layer is permeated and the other is the metal electrode or metal-containing electrode each reflecting light.

In concrete, the following structures are included.

(1) Anode/Light-emitting layer/Cathode
(2) Anode/Hole injecting layer/Light-emitting layer/Cathode
(3) Anode/Light-emitting layer/Electron injecting layer/Cathode
(4) Anode/Hole injecting layer/Light-emitting layer/Electron injecting layer/Cathode For the anode of the electroluminescent element, a metal, an alloy and an electrically-conductive compound each having a high working function of not less than 4 eV, and mixture thereof are preferably used as the electrode material. Concrete examples of such the electrode material include a metal such as Au, and a transparent electrically-conductive material such as CuI, indium tin oxide (ITO), $SnO_2$, ZnO and Zn-doped indium oxide (IZO). The electrode of such the materials is a transparent electrode. The anode may be prepared by depositing or spattering such the electrode material to form a thin layer, and forming the layer into a desired form by a photolithographic method. When required precision of the pattern is not so high, about less than 100 mm, the pattern may be formed by depositing or spattering through a mask having a desired form.

When light is output through the anode, it is desired that the transparence of the anode is 10% or more, and the sheet resistivity of the anode is preferably not more than several hundreds $\Omega/\square$. It is preferably within the range of from approximately 10 nm to 1 $\mu$m, more preferably from 10 to 200 nm, although the thickness of the anode may be optionally selected.

On the other hand, for the cathode, a metal (also referred to an electron injecting metal), an alloy, and an electrically-conductive compound each having a low working function (not more than 4 eV), and a mixture thereof are used as the material of electrode.

Concrete examples of such the electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture and a rare-earth metal.

Among then, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture and lithium/aluminum mixture, is suitable from the view point of the electron injection ability and the resistivity to oxidation.

The cathode can be prepared by making such the material to a thin layer by a method such as a deposition or spattering method. The sheet resistivity of the cathode is preferably not more than several hundreds $\Omega/\square$ and the thickness of the cathode is preferably from 10 nm to 1 μm, more preferably from 50 to 2,000 nm.

It is preferable for raising the light emission efficiency that the electrode arranged between the light-emitting layer and the color conversion layer is transparent or semi-transparent so as to permeate light therethrough.

The foregoing light-emitting layer is a layer in which an electron and a hole each injected from the electrode, electron transporting layer and the hole transporting layer are recombined to emit light. The position of the light emission may be either the interior of the layer or the interface of the light-emitting layer and the layer adjacent to the light-emitting layer.

The material to be used for the hole injecting layer (hereinafter referred to a hole injecting material) can be optionally selected from known materials without any limitation so far as the material has the preferable property mentioned above, such as those employed for hole charge injection materials conventionally or known material for EL element in the hole injecting layer.

The light-emitting material may have the hole transporting ability or the electron transporting ability additional to the light emitting ability. Almost of the foregoing hole transporting material and the electron transporting material are usable as the light emitting material.

The light emitting material may be a polymer such as a p-polyphenylenvinylene and a polyolefin. Moreover, a polymer in the polymer chain of which the light emitting material is introduced or a polymer having the light emitting material as the main chain thereof may be used.

A dopant or guest substance may be used in the light-emitting layer. The dopant may be optionally selected from known substance usually used as the dopant of the EL element. Concrete examples of the dopant include, for example, quinacridone, DCM, a coumarin derivative, rhodamine, rubrene, decacyclene, a pyrazoline derivative, a squarilium derivative and an europium complex.

The electron injecting layer can be formed by making the electron injecting material to a thin layer by a known method such as a vacuum deposition method, a spin coating method, a casting method and a LB method. The thickness of the hole injecting layer is preferably approximately from 5 nm to 5 μm even though there is no specific limitation thereon. The electron injecting layer may have a single layer structure containing one or more kinds of the electron injecting material or a stacked layer structure composed of plural layers having the same or different composition.

The light-emitting layer can be formed by dissolving the foregoing light emitting material together with a binder in a solvent to prepare a solution and the solution is made to a thin layer by a spin coating method such as that described in JP O.P.I. No. 57-51781. The thickness of the light-emitting layer may be optionally selected without any specific limitation and is usually within the range of from 5 nm to 5 μm.

In the invention, the light emitted from the light-emitting layer has color within the bluish purple region. The color within the bluish purple region of the light emitted from the EL element according to the invention is measured by Spectroradiometer CS-1000, manufactured by Minolta Co., Ltd., and the measured result is in the region of purplish blue or bluish purple of the CIE coordinate described in FIG. 4.16 on page 108 of "New Edition of Color Science Handbook", edited by Nihon Shikisai Gakkai, published by Tokyo Daigaku Shuppankai, 1985.

The compound having the maximum peak of fluorescent spectrum within the range of from 350 nm to 420 nm in a solution, and a fluorescence quantum yield not less than 0.1 is preferable.

A part of concrete examples is shown below.

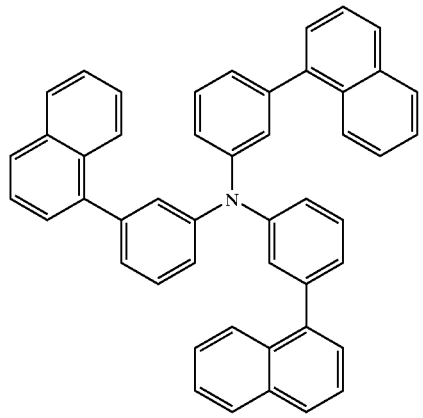

BP-1

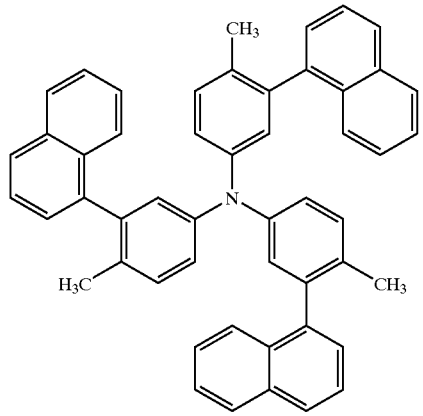

BP-2

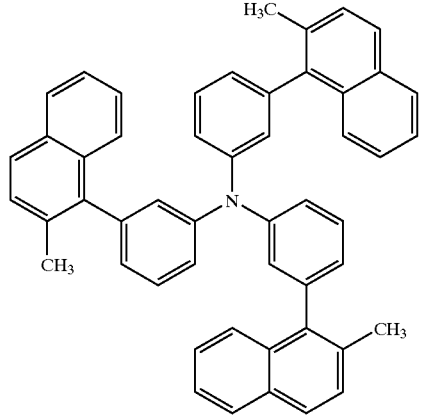

BP-3

BP-4
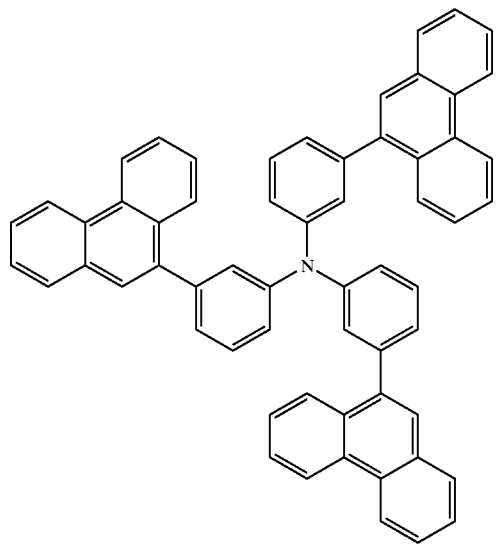
BP-5
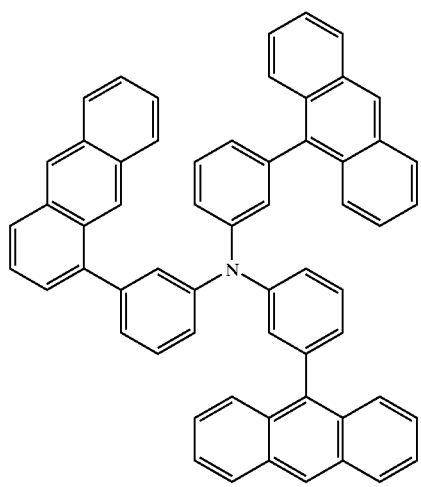
BP-6
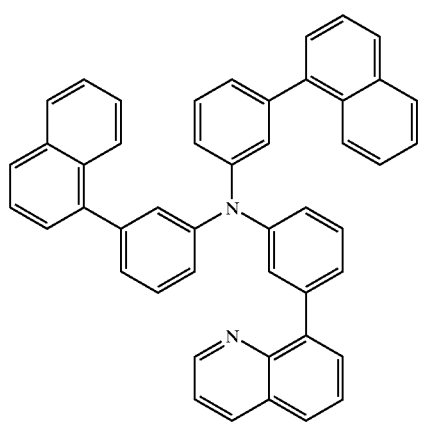
BP-7
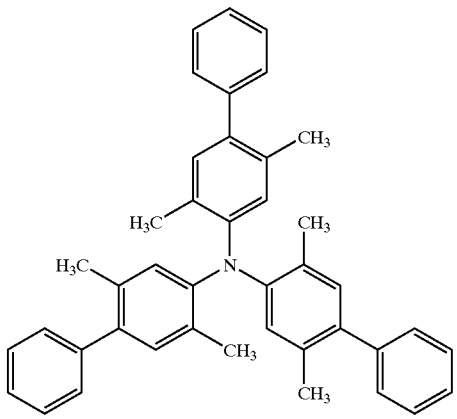
BP-8
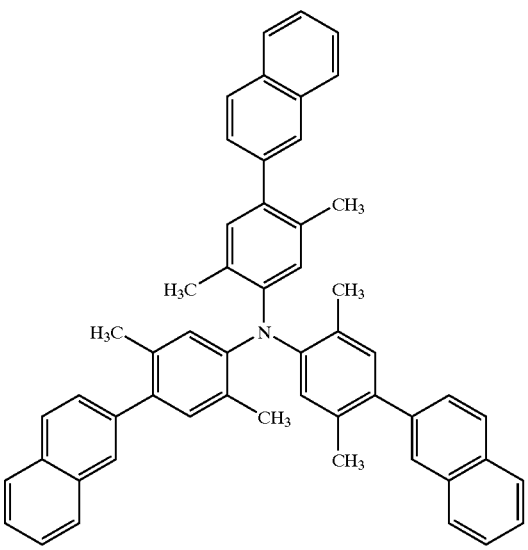
BP-9
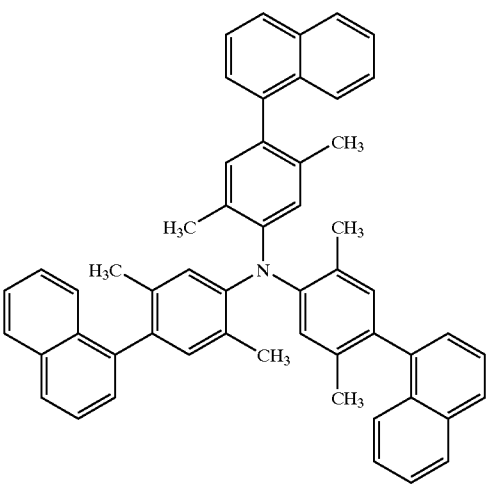

BP-10
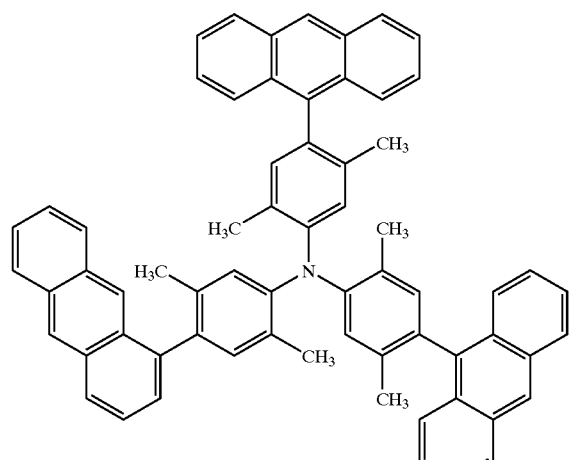
BP-11
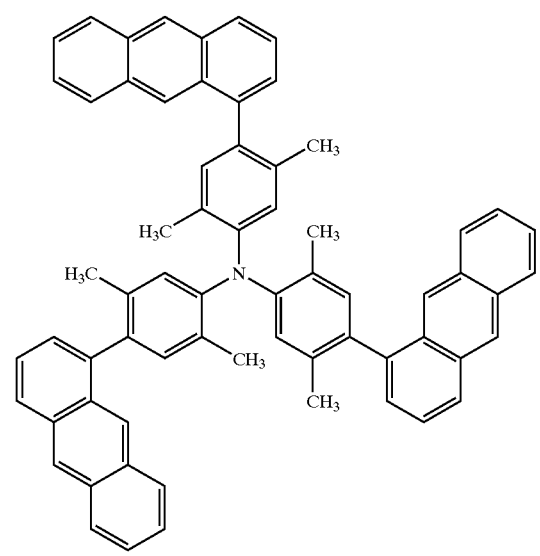
BP-12
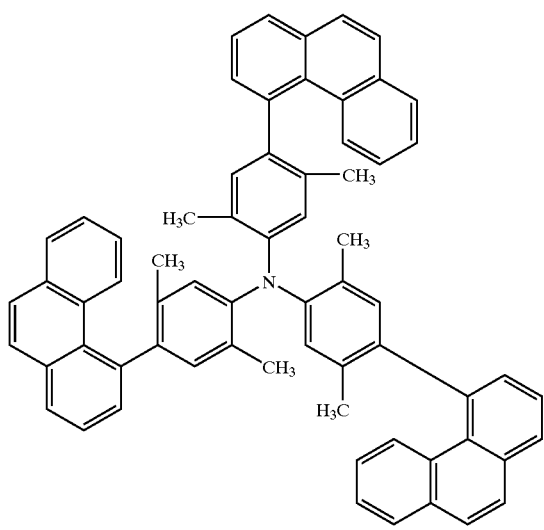
BP-13
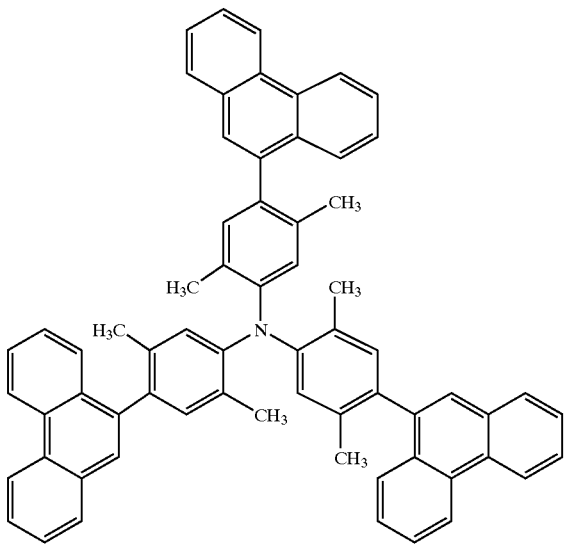
BP-14
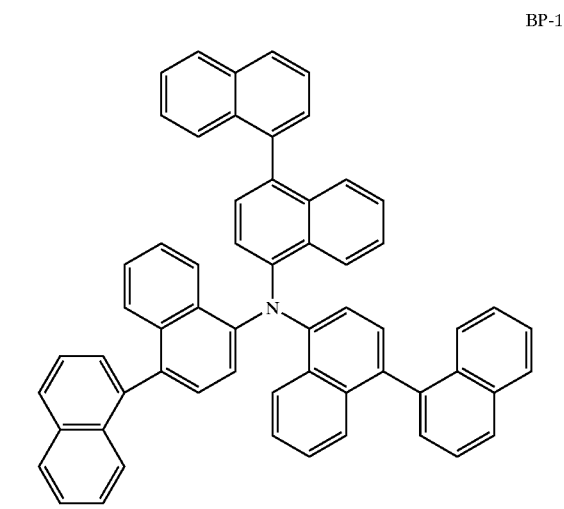
BP-15
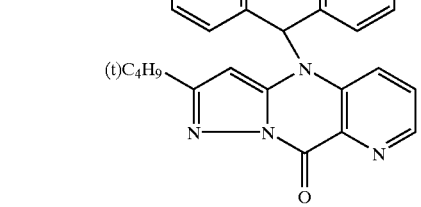
BP-16
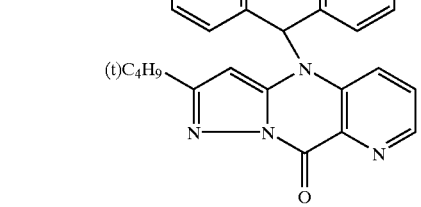

BP-17
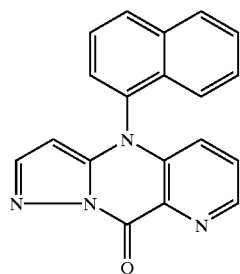
BP-18
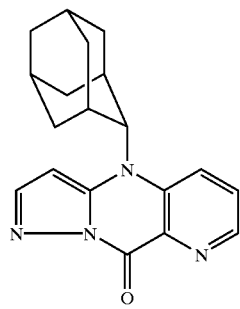
BP-19
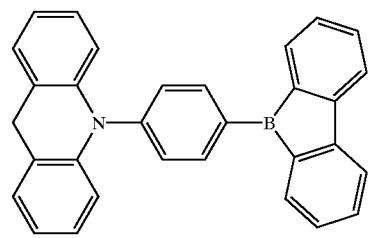
BP-20
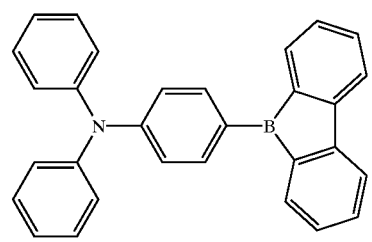
BP-21
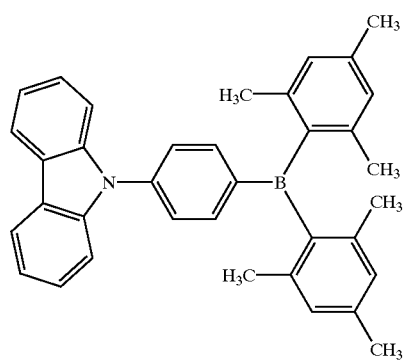
BP-22
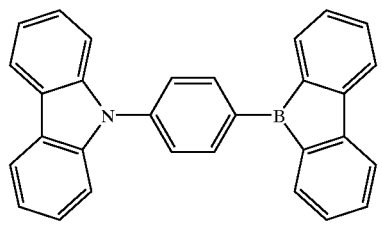
BP-23
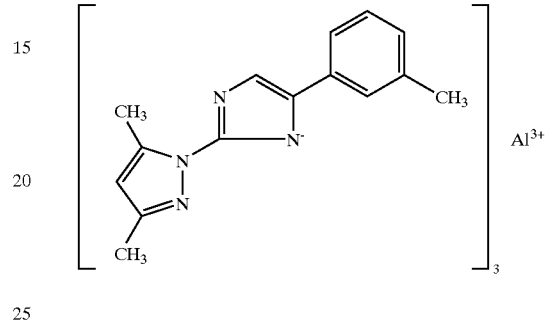
BP-24
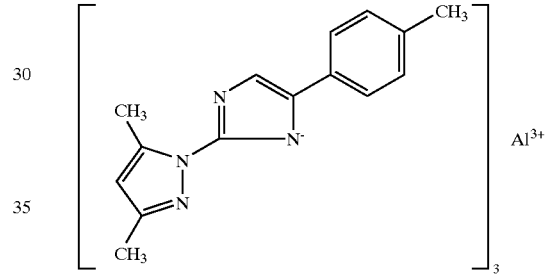
BP-25
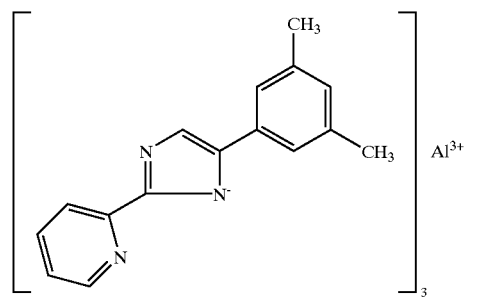
BP-26
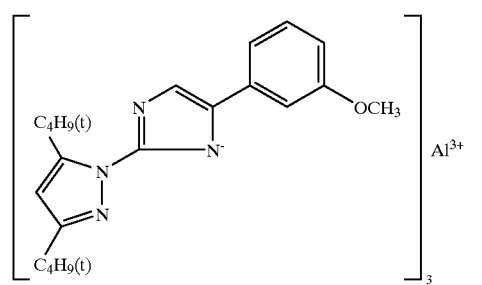

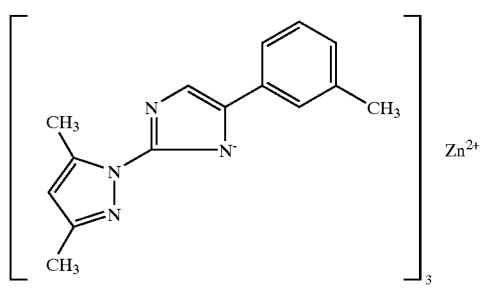

BP-27

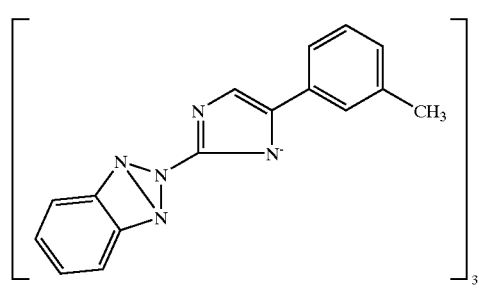

BP-28

A synthetic example of the foregoing light emitting material BP-9 is shown below.

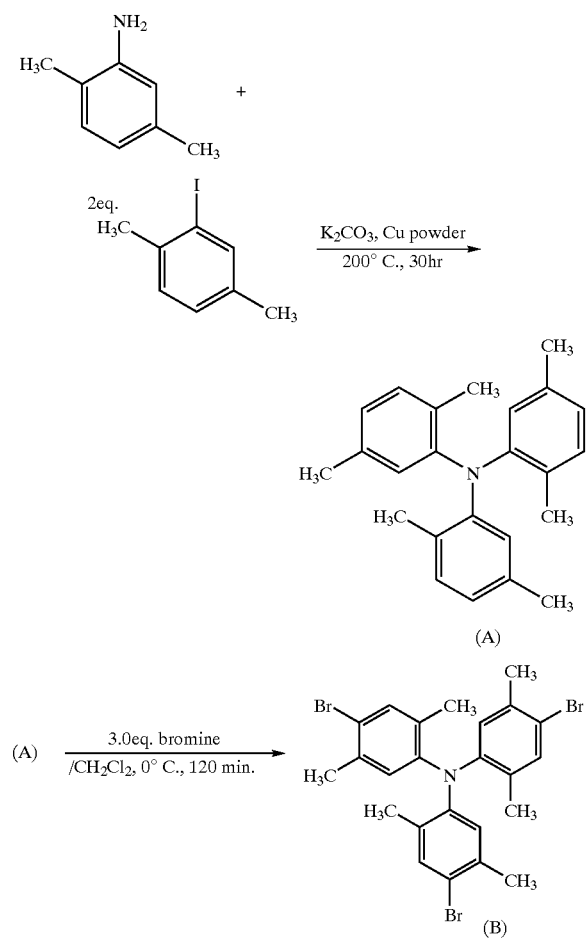

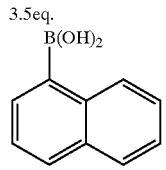

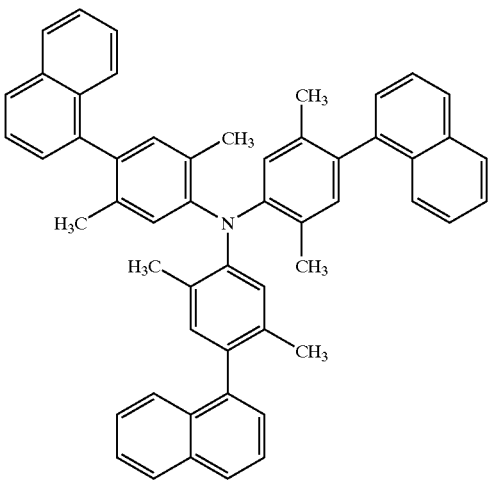

BP-9

Ten gram of 2,5-dimethyliodobenzene, 2.37 g of 2,5-dimethylaniline, 1.25 g of copper powder and 2.98 g of potassium carbonate were stirred at 200° C. for 30 hours. Tetrahydrofuran, ethyl acetate and water were added to the reacting liquid and the mixture was filtered through Celite and then removed the water layer. The remained organic layer was washed with a saturated sodium chloride solution, dried by magnesium sulfate, concentrated, purified by a column and recrystallized using ethyl acetate. Thus 5 g of triphenylamine (A) was obtained. Next, 2.0 g of (A) was added to 25 ml of methylene chloride and 2.9 g of bromine was dropped to the solution and stirred for 1 hour. Then the solution was concentrated and purified. Thus 2.7 g of tris(4-bromo-2,5-dimethylphenyl)amine (B) was obtained. Then 1.0 g of (B) was reacted with 1.0 g of naphthylboric acid in a two-layer solvent system composed of 50 ml of tetrahydrofuran and 5 ml of water in the presence of potassium carbonate and a palladium catalyst. Thus 690 mg of BP-9 was obtained. It was confirmed by NMR and mass spectrum that the obtained substance is the objective compound.

The physical data of BP-9: $^{1}$H-NMR (400 MHz, CDCl$_3$) δ/ppml. 96 (s, 9H), 2.05 (s, 9H), 6.90 (s, 3H), 7.09 (s, 3H), 7.40 (t, J=6.8 Hz, 3H), 7.41 (t, J=6.8 Hz, 3H), 7.47 (t, J=6.8 Hz, 3H), 7.52b(t, J=8.1 Hz, 3H), 7.54 (m, 3H), 7.84 (d, J=8.1 Hz, 3H), 7.89 (d, J=8.1 Hz, 3H) and MS (FAB)m/z707 (M$^+$).

In the invention, a hole injecting layer, which may be provided according to necessity, has a function of transporting the hole injected from the anode to the light-emitting layer. Many holes can be injected in a lowered electric field by the presence of the hole injecting layer between the anode and the light-emitting layer. Moreover, the light-emitting ability of the element is made excellent by raising the light-emitting efficiency since the electrons injected into the light-emitting layer from the cathode or the electron injecting layer are accumulated at the interface in the light-emitting layer by a barrier to electron existing at the interface between the light-emitting layer and the hole injecting layer.

The material to be used for the hole injecting layer, hereinafter referred to a hole injecting material, can be optionally selected from known materials without any limitation so far as the material has the preferable property mentioned above, such materials as those conventionally used as the hole injecting materials or known materials used in the hole injecting layer.

The hole injecting material may be either an organic substance or an inorganic substance so far as it has hole injecting ability or an ability to form a barrier against electron. Examples of that include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styrylanthracene derivative, a fluorenone derivative, a hydrazone derivative, a stilbene derivative, a silazane derivative, an aniline copolymer, and an electroconductive polymeric oligomer, particularly a thiophene oligomer.

It is preferred to employ porphyrin compounds, aromatic tertiary amine compounds and styrylamine compounds, particularly, the aromatic tertiary amine compounds in addition to the hole injecting materials mentioned above. Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)phenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP O.P.I. No. 4-308688 such as 4,4',4"-tris[N-(3-methylphenyl)-N-phenylamino]-triphenylamine (MTDATA) in which three triphenylamine units are bonded in a starburst form.

A polymer in which the foregoing material is introduced into the polymer chain thereof or a polymer including the foregoing material as the main chain thereof are also usable.

Moreover, an inorganic compound such as p-Si and p-SiC is also usable as the hole transporting material other than the above-mentioned. A compound emitting fluorescent light having the maximum wavelength of not more than 420 nm in a solution or a non-fluorescent substance with the fluorescence quantum efficiency of less than 0.01 is preferably used as the hole transporting material to obtain the emission light in the region of bluish purple of the preferable embodiment of the invention. The typical examples are shown below.

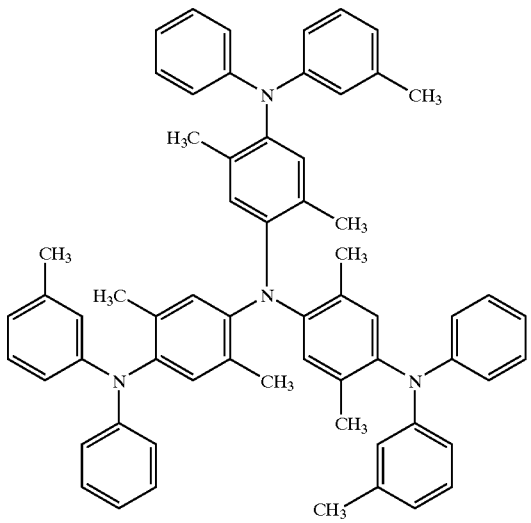
HT-1

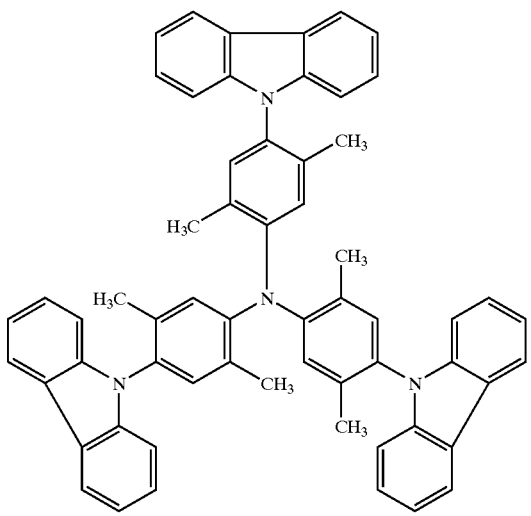
HT-2

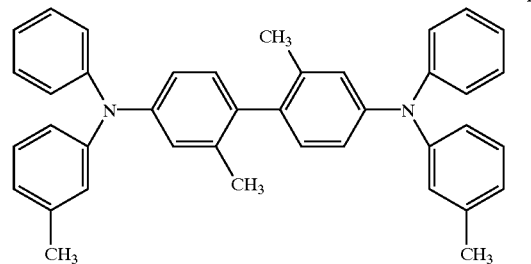
HT-3

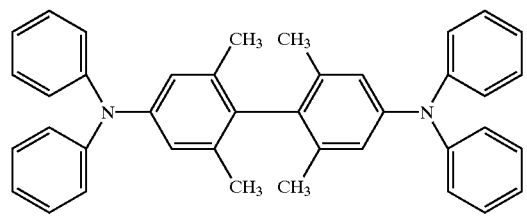
HT-4

The hole injecting layer can be formed by making the hole injecting material to a thin layer by a known method such as a vacuum deposition method, a spin coating method, a casting method and a LB method. The thickness of the hole injecting layer is preferably approximately from 5 nm to 5 µm even though there is no specific limitation thereon.

The hole injecting layer may be composed of single layer structure comprising one or two or more materials mentioned above, or plural layers structure composed of single composition or different compositions.

The electron injecting layer provided according to necessity is a layer having a function of transporting electrons injected from the cathode to the light-emitting layer. The material of the electron injecting layer may be optionally selected from known compounds.

Examples of the material of the electron injecting layer, hereinafter referred to electron injecting material, include a nitro-substituted fluorene derivative, a diphenylquinone derivative, a thiopyran dioxide derivative, a heterocyclic tetracarboxylic acid anhydride such as naphthaleneperylene, a carbodiimide, a fluolenylidenemethane derivative and an anthraquinodimethane, and enthrone derivative, and a oxadiazole derivative. It is found by the inventors that a series of electron transporting compounds described in JP O.P.I. No. 59-194393 can be used as the electron injecting material even though the compounds are described in the publication as the material for making the light-emitting layer. Moreover, a thiadiazole derivative which is formed by substituting the oxygen atom in the oxadiazole ring of the foregoing oxadiazole derivative by a sulfur atom, an arylamino- or an alkylamino-substituted triazole derivative and a quinoxaline derivative having a quinoxaline ring known as an electron withdrawing group are usable as the electron injecting material.

A polymer in which the foregoing material is introduced into the polymer chain thereof or a polymer including the foregoing material as the main chain thereof are also usable.

A metal complex of 8-quinolynol derivative such as aluminum tris-(8-quinolynol) (Alq), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), zinc bis-(8-quinolynol) (Znq), and a metal complex formed by replacing the central metal of the foregoing complexes with another metal atom such as In, Mg, Cu, Ca, Sn, Ga or Pb, can be used as the electron injecting material. Furthermore, a metal free and metal-containing phthalocyanine, and a derivative thereof in which the terminal of each of the compounds is replaced by a substituent such as an alkyl group or a sulfonic acid group are also preferably used as the electron injecting material. A distyrylpyrazine derivative exemplified as a material for the light-emitting layer may preferably be employed as the electron injecting material. An inorganic semiconductor such as n-Si and n-SiC may also be used as the electron injecting material similar to the hole injecting layer.

A compound emitting fluorescent light of a short wavelength is preferable as the electron transporting material to obtain the light in the bluish purple region as the same as in the case of the hole transporting layer. A compound emitting fluorescent light with the maximum peak wavelength of not more than 420 nm in a solution is preferable. A non-fluorescent compound with a fluorescence quantum efficiency of less than 0.01 is also preferable.

The electron transporting layer can be formed by making such the compound to a thin layer by a known method such as a vacuum deposition method, a spin coating method and a LB method. The thickness of the light-emitting layer may be selected without any specific limitation and is usually selected from the range of from 5 nm to 5 µm. The electron transporting layer may be a single layer containing one or more kinds of the electron transporting material or a stacked layer type layer including plural layers each having the same of different composition.

A buffer layer, also referred as to an electrode interface layer, may be provided between the anode and the light-emitting layer or the cathode and the light-emitting layer or the electron transporting layer.

The buffer layer is a layer arranged between the electrode and the organic compound layer for reducing the driving voltage or improving the light emitting efficiency. The buffer layer is described in detail in "Organic El element and the forefront of industrialization thereof" Vol. 2, Section 2 "Material of Electrode" pp. 123–166, 30 Nov. 1998, NTS Co., Ltd. In concrete, an anode buffer layer and a cathode buffer layer are applicable.

The anode buffer layer is described in detail in JP O.P.I. Nos. 9-45479, 9-260062 and 8-288069. Concrete examples include a phthalocyanine buffer layer typified by copper phthalocyanine, an oxide buffer layer typified by vanadium oxide, an amorphous carbon buffer layer and a polymer buffer layer using an electroconductive polymer such as a polyaniline (emeraldine) and a polythiophene.

The cathode buffer layer is described in detail in JP O.P.I. Nos. 6-325871, 9-17574 and 10-74586. Concrete examples include a metal buffer layer typified by strontium and aluminum, an alkali metal compound buffer layer typified by lithium fluoride, an alkali-earth metal compound buffer layer typified by magnesium fluoride and an oxide buffer layer typified by aluminum oxide.

The buffer layer is preferably an extreme thin layer, and preferable thickness is within the range of from 0.1 to 100 nm even though the thickness may be change depending on the material.

In the organic EL element according to the invention, a layer having a function other than the foregoing layer may be stacked additionally to the foregoing basic constituting layers. For example, a functional layer such as a hole blocking layer may be provided, which is described in JP O.P.I. Nos. 11-204258 and 11-204359, and "Organic El element and the forefront of industrialization thereof" p. 237, 30 Nov. 1998, NTS Co., Ltd.

The dielectric mirror comprises stacked plural layers each of which is different in the refracting index thereof. A layer constituted by stacking plural layers mainly composed of silicone oxide $SiO_2$ and a layer mainly composed of titanium oxide $TiO_2$ is preferably used. For example, a stacked mirror composed by alternatively triple stacking the layers of $TiO_2$ having a refracting index of 2.40 and $SiO_2$ having a refractive index 1.46 can be used. In such the case, a reflectance approximately 60% is obtained near a wavelength of 550 nm. The region of the reflecting wavelength or the stop band width can be optionally designed by controlling the layer thickness so as to satisfy the condition of $\lambda/4$.

The foregoing $SiO_2$ and $TiO_2$ may be partially nitrogeized by adding nitrogen at the time of the layer formation according to necessity, particularly when improvement in the barrier ability against gas of them is required. In this case, the oxides are each became a oxonitride represented by $SiO_xN_y$ and $TiO_xN_y$, respectively. Although the barrier ability against gas is raised by increasing the nitrogen ratio, the transparency is lowered. Therefore, the relation of the x and y are preferably $0.4 \leq x/(x+y) \leq 0.8$.

Glass, quartz and a transparent resin film are usable as the transparent substrate. In the invention, the transparent resin film is preferably used as the transparent substrate. Examples of the resin film include, for example, a film of poly(ethylene terephthalate) (PET), poly(ethylene naphthalate) (EN), poly(ether sulfon) (PES), polyetherimide, poly(ether ether ketone), poly(phenylene sulfide), polyallylate, polyimide, polycarbonate (PC), cellulose triacetate (TAC) and cellulose acetate propionate (CAP).

Although there is no limitation on the transparent substrate having the structure of the dielectric mirror structure so far as the substrate has the structure of stacked layers each different in the refractive index from each other. One in which the dielectric mirror is arranged on the upper side of the transparent substrate is preferred.

Although the transparent substrate having the dielectric mirror structure according to the invention of course can be used for the organic EL element according to the invention, also may be applied to another use such as a translucent type liquid crystal displaying apparatus, a spatial light modulator and an electro-optical apparatus.

When the transparent substrate having the dielectric mirror structure is applied to the organic EL element according to the invention, the later-mentioned color conversion member may be provided between the transparent substrate and the dielectric mirror, and a protective layer may be further provided on the dielectric mirror according to necessity.

As to the transparent substrate having the dielectric mirror structure, various methods such as an deposition method and spattering method can be applied to form the dielectric mirror on the upper side of the transparent substrate.

The color conversion member is preferably a color conversion layer. The color conversion member contains a fluorescent dye which absorbs the light emitted from the organic EL member and converts the wavelength of the light to emit visible fluorescent light.

The fluorescent dye may be an organic fluorescent substance or an inorganic fluorescent substance and may be selected according to the objective wavelength.

Examples of the fluorescent dye include a coumarin dye, a pyran dye, a cyanine dye, a squarilium dye, an oxobenzanthracene dye, a fluorescein dye, a rhodamine dye, a pyrylium dye, a perylene dye, a stilbene dye and a polythiophene dye.

As the inorganic fluorescent substance, one in a form of fine particle having a particle diameter of not more than 3 $\mu$m is preferable and a ultra fine particle fluorescent substance is more preferable.

The inorganic fluorescent substance is preferably an inorganic fluorescent substance comprising a mother crystal and an activator or a rare-earth complex fluorescent substance.

The composition of the inorganic fluorescent substance is preferably a combination of a metal oxide such as $Y_2O_2S$, $Zn_2SiO_4$ and $Ca_5(PO_4)_3Cl$ or a sulfide such as $ZnS$, $SrS$ and $CaS$ as the mother crystal, and an ion of rare-metal such as Ce, Pr, Nd, Pm, Sm, Eu, Gd, Tb, Dy, Ho, Er, Tm and Yb or an ion of metal such as Ag, Al, Mn, In, Cu and Sb as the activator or co-activator.

In detail, a metal oxide such as aluminum oxide, silicon oxide, phosphoric acid and halophosphoric acid each replaced by an alkali-earth metal, for example, $(X)_3Al_{16}O_{27}$, $(X)_3Al_{14}O_{25}$, $(X)_3Al_2Si_2O_{10}$, $(X)_4Si_2O_8$, $(X)_2Si_2O_6$, $(X)_2P_2O_7$, $(X)_2P_2O_5$, $(X)_5(PO_4)_3Cl$ and $(X)_2Si_3O_8$-$2(X)Cl_2$ can be cited as the typical mother crystal. In the above, X is an alkali-earth metal. The alkali-earth metal represented by X may be a single kind or a mixture of two or more kinds, and the mixing ratio of the metals is optional.

Examples of another preferable mother crystal include an oxide and sulfide of zinc, an oxide of rare-earth metal such as yttrium, gadolinium and lanthanum and the oxide in which a part of oxygen is replaced by a sulfur atom, a sulfide of rare-earth metal and such the oxide and sulfide combined with an optional metal element.

Preferable examples of the mother crystal are shown below: $Mg_4GeO_{5.6}F$, $Mg_4GeO_6$, $ZnS$, $Y_2O_2S$, $Y_3Al_5O_{12}$, $Y_2SiO_{10}$, $Zn_2SiO_4$, $Y_2O_3$, $BaMgAl_{10}O_{17}$, $BaAl_{12}O_{19}$, $(Ba, Sr, Mg)O \cdot aAl_2O_3$, $(Y, Gd)B_3$, $(Zn, Cd)S$, $SrGa_2S_4$, $SrS$, $GaS$, $SnO_2$, $Ca_{10}(PO_4)_6(F, Cl)_2$, $(Ba, Sr)(Mg, Mn)Al_{10}O_{17}$, $(Sr, Ca, Ba, Mg)_{10}(PO_4)_6Cl_2$, $(La, Ce)PO_4$, $CeMgAl_{11}O_{19}$, $GdMgB_5O_{10}$, $Sr_2P_2O_7$, $Sr_4Al_{14}O_{25}$, $Y_2SO_4$, $Gd_2O_2S$, $Gd_2O_3$, $YVO_4$ and $Y(P, V)O_4$.

The foregoing mother crystal and the activator or co-activator may be one replaced in a part by an element of the same group in a part thereof. There is no limitation on the element composition of the fluorescent substance so far as the substance can emit visible light by absorbing light within the bluish purple region.

In the invention, an ion of a lanthanoid metal such as La, Eu, Tb, Ce, Yb and Pr and hat of a metal ion such as Ag, Mn, Cu, In and Al are preferable as the activator or the co-activator of the inorganic fluorescent substance. The doping amount of the activator or the co-activator is preferably from 0.001 to 100 mole-%, more preferably from 0.01 to 50 mole-%, of the mother crystal.

The activator or the co-activator is doped in the mother crystal by replacing a part of ions constituting the mother crystal by the ion such the lanthanoid ion.

The actual composition of the crystal of the fluorescent substance exactly has the following composition formula. However, the influence of the amount of the activator on the substantial fluorescence characteristics of the substance is usually small. Therefore, the value of the following x and y is not described unless a specific description is added. For example, $Sr_{4-x}Al_{14}O_{25}:Eu^{2+}_x$ is described as $Sr_4Al_{14}O_{25}:Eu^{2+}$ in the invention.

The composition formulas of typical inorganic fluorescent substances, inorganic fluorescent substance comprised of the mother crystal and the activator, are shown below, but the invention is not limited by the followings: $(Ba_zMg_{1-z})_{3-x-y}Al_{16}O_{27}:Eu^{2+}_xMn^{2+}_y$, $Sr_{4-x}Al_{14}O_{25}:Eu^{2+}_x$, $(Sr_{1-z}Ba_z)_{1-x}Al_2Si_2O_8:Eu^{2+}_x$, $Ba_{2-x}SiO_4:Eu^{2+}_x$, $Sr_{2-x}SiO_4:Eu^{2+}_x$, $Mg_{2-x}SiO_4:eU^{2+}_x$, $(BaSr)_{1-x}SiO_4:Eu^{2+}_x$, $Y_{2-x-y}SiO_5:Ce^{3+}_x$, $Tb^{3+}_y$, $Sr_{2-x}P_2O_5:Eu^{2+}_x$, $Sr_{2-x}P_2O_7:Eu^{2+}_x$, $(Ba_yCa_zMg_{1-y-z})_{5-x}(PO_4)_3Cl:Eu^{2+}$ and $Sr_{2-x}Si_3O_8$-$2SrCl_2:Eu^{2+}_x$. In the above, x, y and z are each an optional number of not more than 1.

Examples of the inorganic fluorescent substance preferably used in the invention are shown below.

Blue Light-Emitting Inorganic Fluorescent Substance (BL-1) $Sr_2P_2O_7:Sn^{4+}$ (BL-2) $Sr_4Al_{14}O_{25}:Eu^{2+}$ (BL-3) $BaMgAl^{10}O^{17}:Eu^{2+}$ (BL-4) $SrGa_2S_4:Ce^{3+}$ (BL-5) $CaGa_2S_4:Ce^{3+}$ (BL-6) $(Ba, Sr)(Mg, Mn)Al_{10}O_{17}:Eu^{2+}$ (BL-7) $(Sr, Ca, Ba, Mg)_{10}(PO_4)_6Cl_2:Eu^{2+}$ (BL-8) $BaAl_2SiO_8:Eu^{2+}$ (BL-9) $Sr_2P_2O_7:Eu^{2+}$ (BL-10) $Sr_5(PO_4)_3Cl:Eu^{2+}$ (BL-11) $(Sr, Ca, Ba)_5(PO_4)_3Cl:Eu^{2+}$ (BL-12) $BaMg_2Al_{16}O_{27}:Eu^{2+}$ (BL-13) $(Ba, Ca)_5(PO_4)_3Cl:Eu^{2+}$ (BL-14) $Ba_3MgSi_2O_8:Eu^{2+}$ (BL-15) $Sr_3MgSi_2O_8:Eu^{2+}$ Green Light-Emitting Inorganic Fluorescent Substance
- (GL-1) (BaMg) $Al_{16}O_{27}$:$Eu^{2+}$, $Mn^{2+}$
- (GL-2) $Sr_4Al_{14}O_{25}$:$Eu^{2+}$
- (GL-3) (SrBa)$Al_{12}Si_2O_8$:$Eu^{2+}$
- (GL-4) (BaMg)$_2SiO_4$:$Eu^{2+}$
- (GL-5) $Y_2SiO_5$:$Ce^{3+}$, $Tb^{3+}$
- (GL-6) $Sr_2P_2O_7$—$Sr_2B_2O_5$:$Eu^{2+}$
- (GL-7) (BaCaMg)$_5$(PO$_4$)$_3$Cl:$Eu^{2+}$
- (GL-8) $Sr_2Si_3O_8$-$2SrCl_2$:$Eu^{2+}$
- (GL-9) $Zr_2SiO_4$, $MgAl_{11}O_{19}$:$Ce^{3+}$, $Tb^{3+}$
- (GL-10) $Ba_2SiO_4$:$Eu^{2+}$
- (GL-11) $Sr_2SiO_4$:$Eu^{2+}$
- (GL-12) (BaSr)$SiO_4$:$EU^{2+}$ Red Light-Emitting Inorganic Fluorescent Substance
- (RL-1) $Y_2O_2S$:$Eu^{3+}$
- (RL-2) $YAlO_3$:$Eu^{3+}$
- (RL-3) $Ca_2Y_2(SiO_4)_6$:$Eu^{3+}$
- (RL-4) $LiY_9(SiO_4)_6O_2$:$Eu^{3+}$
- (RL-5) $YVO_4$:$Eu^{3+}$
- (RL-6) CaS:$Eu^{3+}$
- (RL-7) $Gd_2O_3$:$Eu^{3+}$
- (RL-8) $Gd_2O_2S$:$Eu^{3+}$
- (RL-9) Y(P, V)$O_4$:$Eu^{3+}$
- (RL-10) $Mg_4GeO_{5.6}F$:$Mn^{4+}$
- (RL-11) $Mg_4GeO_6$:$Mn^{4+}$
- (RL-12):$K_5Eu_{2.5}$ (WO$_4$)$_{6.25}$
- (RL-13) $Na_5Eu_{2.5}$(WO$_4$)$_{6.25}$
- (RL-14) $K_5Eu_{2.5}F(MoO_4)_{6.25}$
- (RL-15) $Na_5Eu_{2.5}F$ (MoO$_4$)$_{6.25}$ The foregoing inorganic fluorescent substance may be subjected to a surface modifying treatment. The methods of the treatment include a chemical treatment by a silane coupling agent and a physical treatment by addition of a fine particle having a diameter of submicron order and the combination of these treatments.

A rare-earth metal complex containing a rare-earth metal such as Ce, Pr, Nd, Pm, Sm, Eu, Gd, Tb, Dy, Ho, Er, Tm and Yb is usable as the rare-earth complex fluorescent substance. The organic ligand constituting the complex may be an aromatic or non-aromatic, and a compound represented by the following Formula B is preferable.

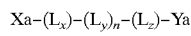    Formula B

In the above formula, $L_x$, $L_y$ and $L_z$ are each independently an atom having two or more bonding hands, n is 0 or 1, Xa is a substituent capable of coordinating at the position adjacent to the $L_x$ and Xa is a substituent capable of coordinating at the position adjacent to $L_z$. An optional portion of Xa with $L_x$ may be condensed to form a ring, an optional portion of Ya and $L_z$ may be condensed to form a ring, $L_x$ and $L_z$ may be condensed with together to form a ring, and at least one aromatic carbon hydride ring or an aromatic heterocyclic ring exists in its molecule. The aromatic carbon hydride ring or the aromatic heterocyclic ring may not be existed when the Xa–(L$_x$)–(L$_y$)$_n$–(L$_z$)–Ya is a β-diketone derivative, a β-ketoester derivative, β-ketoamide and derivative or one in which the oxygen atom of the fore going ketone is replaced by a sulfur or an —N(R$_{201}$)-group, a crown ether, an azacrown ether or a thiacrown ether and one in which the oxygen atom of the crown ether is replaced by an optional number of sulfur atoms or —N(R$_{201}$)-groups.

The R$_{201}$ is a hydrogen atom, a substituted or unsubstituted alkyl group or a substituted or unsubstituted aryl group.

In Formula B, the atom capable of coordinating represented by Xa or Ya is concretely an oxygen atom, a nitrogen atom, a sulfur atom, a selenium atom or a tellurium atom, and the oxygen atom, the nitrogen atom and the sulfur atom are preferable.

In Formula B, the atom having two or more bonding hands represented by $L_x$, $L_y$ or $L_z$ is typically a carbon atom, an oxygen atom, a nitrogen atom, a silicon atom or a titanium atom even though there is no specific limitation. Among them, the carbon atom is preferred.

Concrete examples of the rare-earth metal complex fluorescent substance are shown below, but the invention is not limited by the examples.

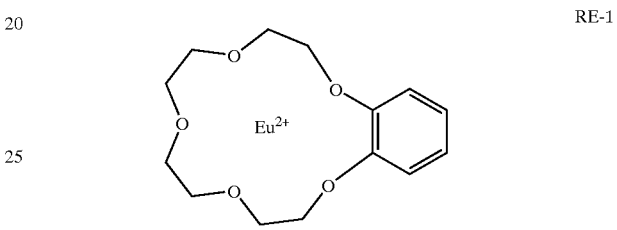

RE-1

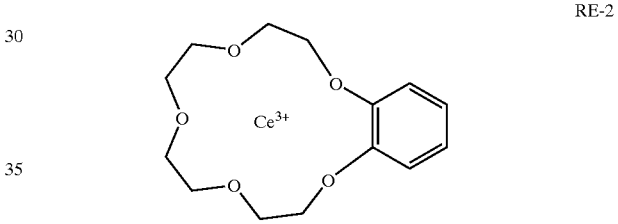

RE-2

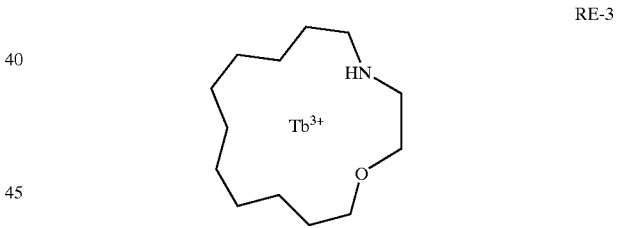

RE-3

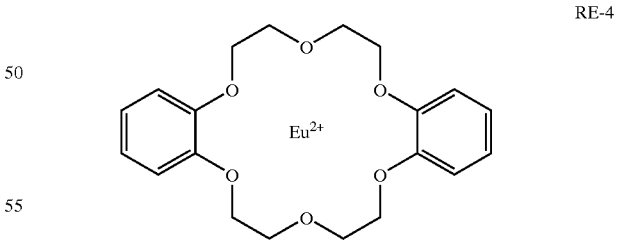

RE-4

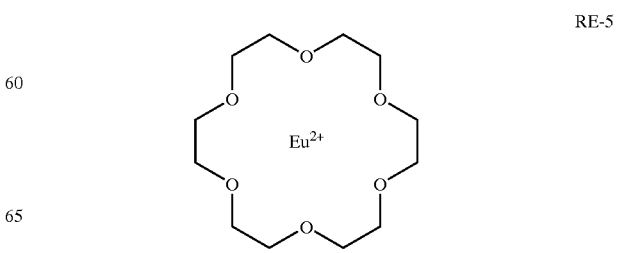

RE-5

RE-6
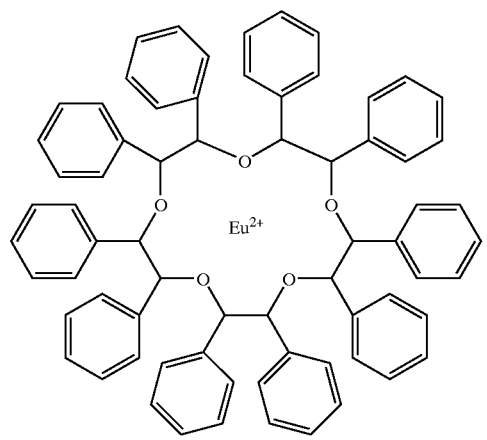
RE-7
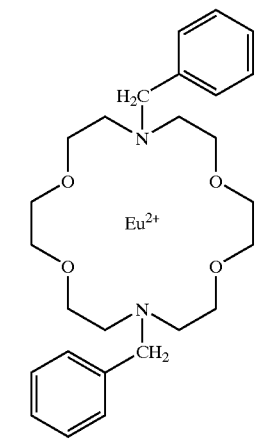
RE-8
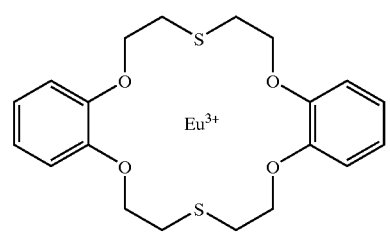
RE-9
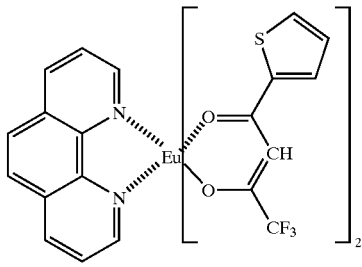
RE-10
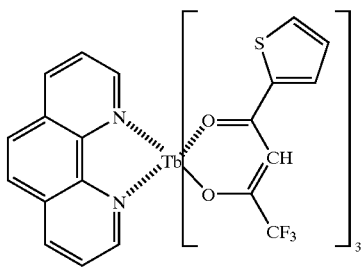
RE-11
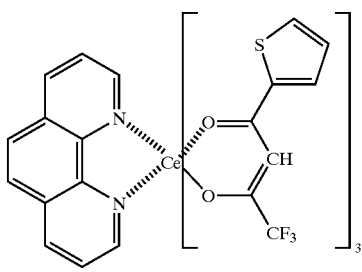
RE-12
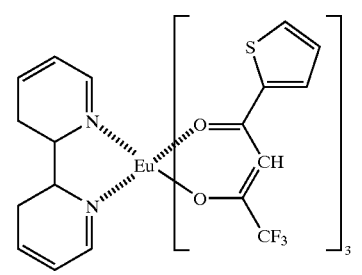
RE-13
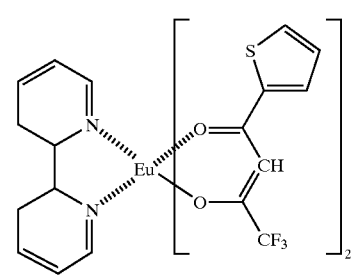
RE-14
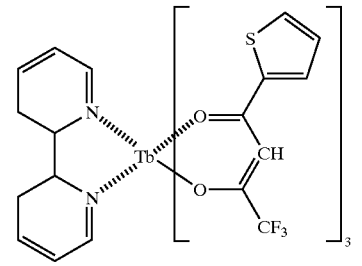
RE-15

RE-16
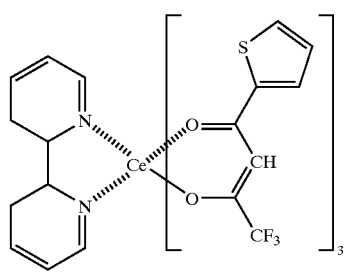
RE-17
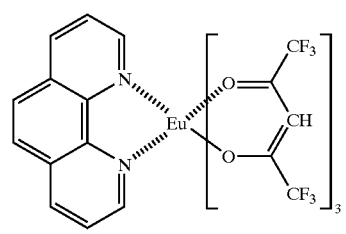
RE-18
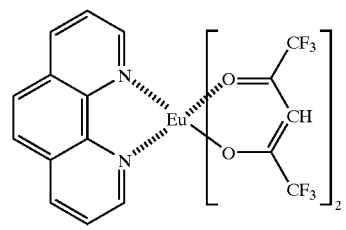
RE-19
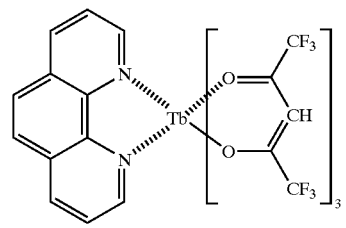
RE-20
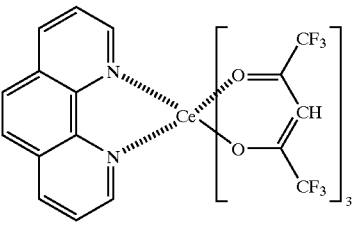
RE-21
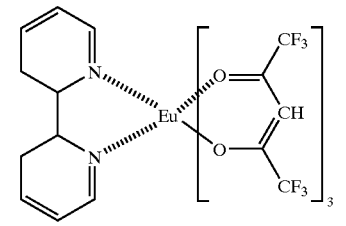
RE-22
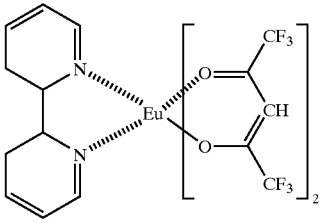
RE-23
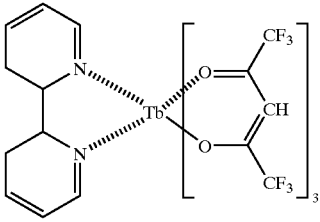
RE-24
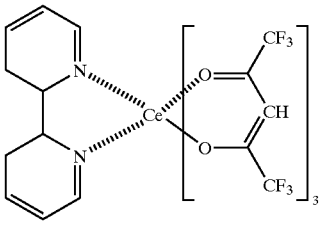
RE-25
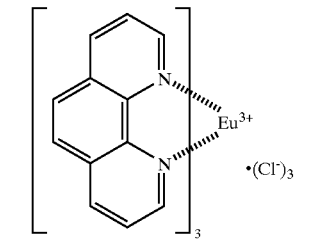
RE-26
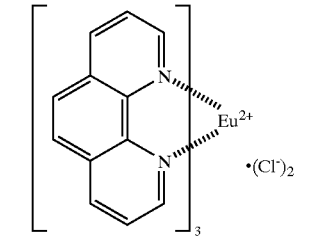
RE-27
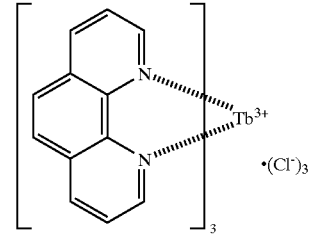

-continued
RE-28
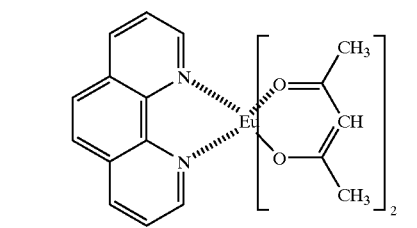
RE-29
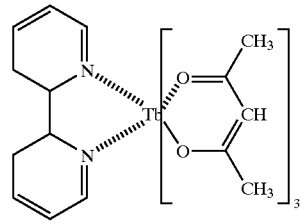
RF-1
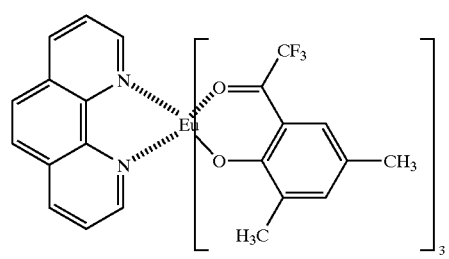
RF-2
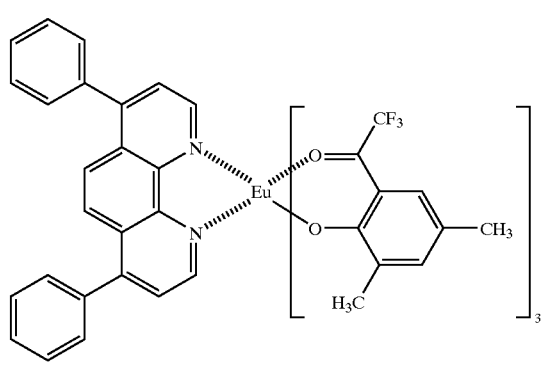
RF-3
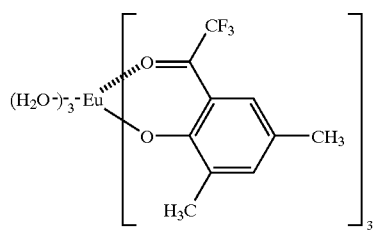
RF-4
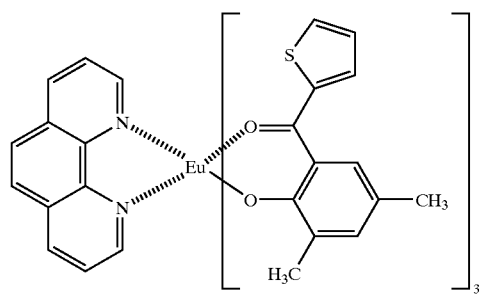
-continued
RF-5
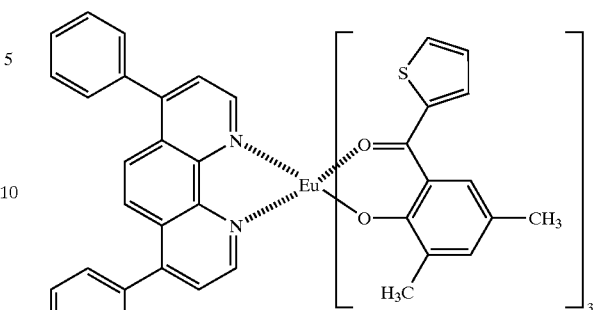
RF-6
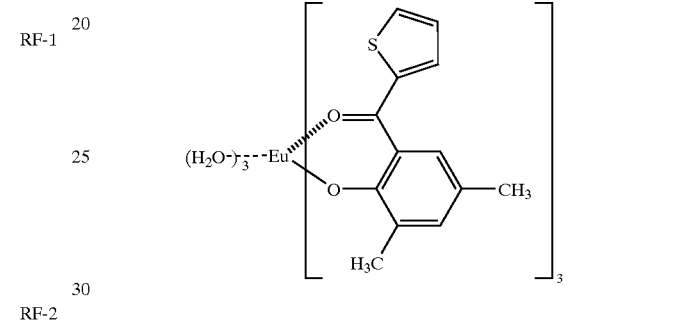
RF-7
RF-8
RF-9

RF-10
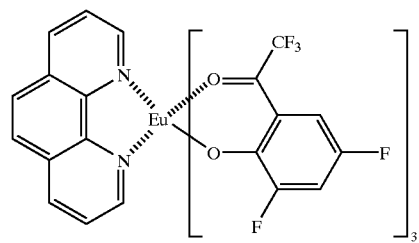
RF-11
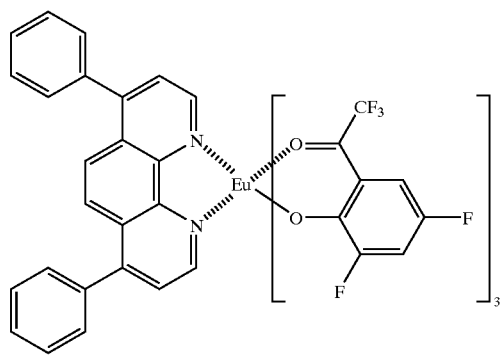
RF-12
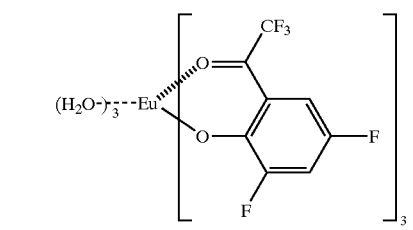
RF-13
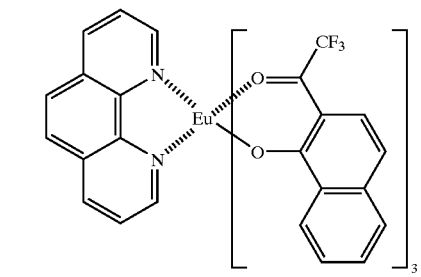
RF-14
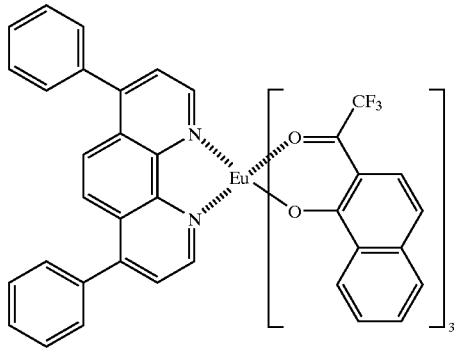
RF-15
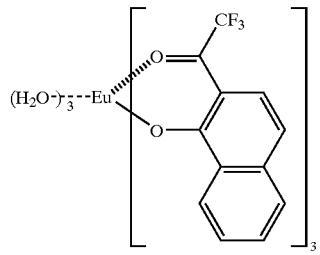
RF-16
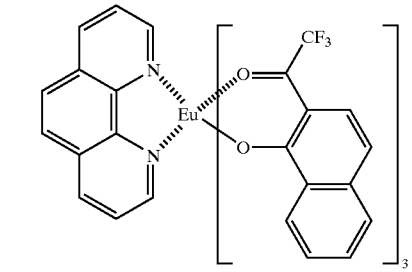
RF-17
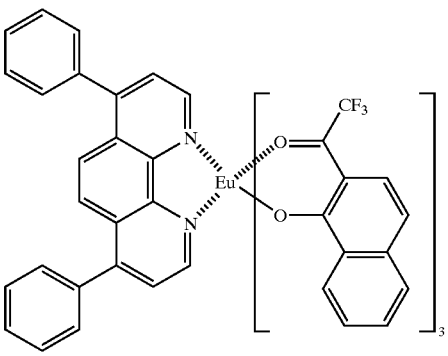
RF-18
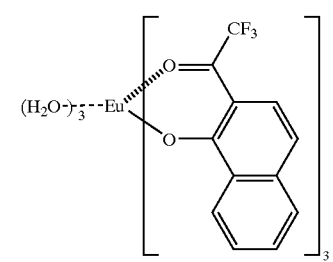
RF-19
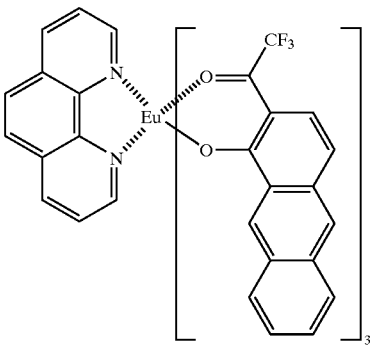

-continued

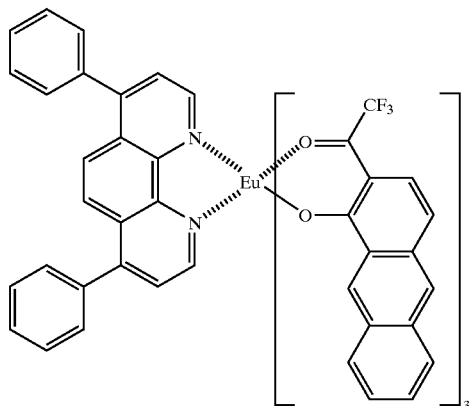

RF-20

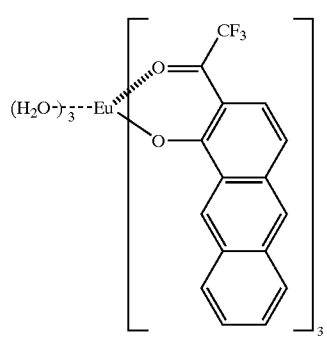

RF-21

The color conversion member is preferably arranged between the transparent electrode and the transparent substrate or at the side of transparent substrate opposite to the transparent electrode, or the front of the light emitting side, even though there is no specific limitation on the position of the color conversion member so far as the color conversion member can absorb the light emitted from the organic EL member having the micro optical resonator.

The color conversion member may be in any form such as a fluorescent substance layer formed by a spattering method or a layer formed by coating the fluorescent substance dispersed in a suitable resin binder. The layer thickness is preferably from 100 nm to 5 mm. When the layer is the coated layer in which the fluorescent substance is dispersed in the suitable resin binder, the concentration of the dispersion may be within the range in which the quenching of the fluorescent light at a high concentration is not occurred and the light emitted from the organic EL member can be sufficiently absorbed. A concentration of from $10^{-7}$ moles to $10^{-3}$ moles per gram of resin is suitable even though the concentration may be changed according to the kind of the fluorescent substance. In the case of the inorganic fluorescent substance, the fluorescent substance can be used in an amount of from approximately 0.1 to 10 g per gram of resin since the quenching of the fluorescent light at a high concentration is almost not occurred in such the fluorescent substance.

The organic EL element according to the invention may be applied as a kind of lump for lighting or an exposing light source or to a projection apparatus for projecting an image and a displaying apparatus for directly viewing an image by human eyes. When the displaying apparatus for reproducing a movie, the driving system of the apparatus may be either a passive matrix system or an active matrix system.

EXAMPLES

Example 1-1

On a polyethersulfon (PES) film available on the market, Sumilite FS-1300 manufactured by Sumitomo Bakelite Co., Ltd., having a size of 25 mm×75 mm and a thickness of 0.1 mm, a dielectric mirror was formed by a RF-magnetron spattering method so that three silicone oxide $SiO_2$ layers and three titanium oxide $Tio_2$ layers were alternately stacked so that the titanium layer is the last layer. The thickness of the silicon oxide layer and that of the titanium oxide layer were each 69 nm and 42 nm, respectively.

The dielectric mirror was designed based on the presumption that the wavelength of the light emitted from the element was 405 nm.

Thus a transparent substrate having the dielectric mirror structure could be prepared using the transparent resin film as the constituting material.

The moisture proof ability of the element was considerably raised compared with the case of only using the PES film.

Example 1-2

A transparent substrate using the transparent resin film as the constituting material and having the dielectric mirror structure was prepared in the same manner as in Example 1-1 except that the silicon oxide layers and the titanium oxide layers were each replaced by silicon oxonitride layers and titanium oxonitride layers, respectively. It was confirmed that thus prepared transparent substrate was considerably improved in the moisture proof ability. (Compared to Example 1-1)

Example 2

A transparent electrically-conductive layer, ITO, having a thickness of 50 nm was formed as an anode on the dielectric mirror of the transparent substrate prepared in Example 1-1 by the RF-magnetron spattering method. Thus prepared substrate was fixed in a vacuum deposition apparatus after sufficient washing by an organic solvent. An m-MTDATXA layer with a thickness of 20 nm as the hole transporting layer, a layer of DMPhen with a thickness of 20 nm as a light-emitting layer and a basocuproin (BC) layer with a thickness of 20 nm were deposited. Then the total thickness of the transparent electrically-conductive layer and the organic compound thin layers was 110 nm. DMPhen is the foregoing BP-13. The structures of m-MTDATXA and BC are shown below.

m-MTDATXA

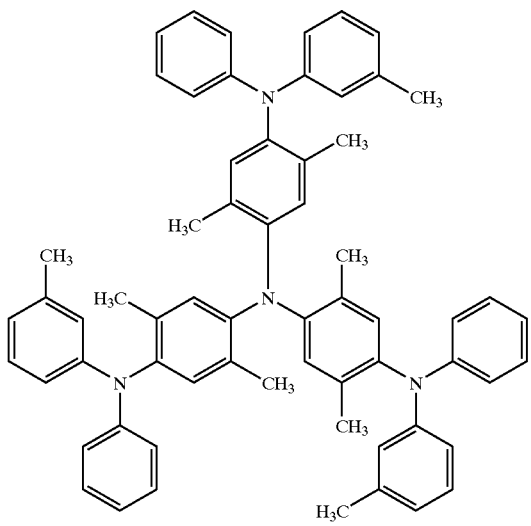

BC

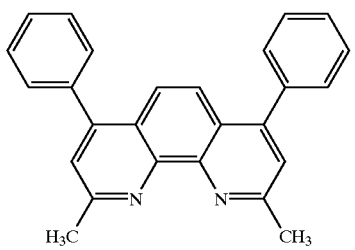

The optical length of the micro optical resonator in the thus obtained element was 1.5 times of the objective wavelength of 405 nm according to the foregoing Equation 1 based on the thickness and the refractive index of the transparent electrically-conductive layer and the organic compound layers and the light penetration deepness into the dielectric mirror.

Then a layer of MgAg (10:1) alloy with a thickness of 180 nm was deposited as a cathode.

<Preparation of Color Conversion Filter Using the Inorganic Fluorescent Substance>

Into 0.16 g of aerogel, 15 g of ethanol and 0.22 g of γ-glycidoxypropyltriethoxysilane were added, and the mixture was stirred for 1 hour at room temperature in an open air system. The mixture was put into a mortar and sufficiently rubbed. Then the mixture was heated in an oven at 70° C. for 2 hours and further for 2 hours at 120° C. Thus surface-modified RL-12 was obtained.

The surface modifying treatment was applied to GL-10 and BL-3 in the same manner as in the RL-12.

To 10 g of the surface-modified RL-12, 30 g of butyral (BX-1) dissolved in 300 g of a mixed solvent of toluene and ethanol in a ratio of 1:1. After stirring, the mixture was coated on a glass plate so as to form a layer having a wet thickness of 200 μm. The coated glass plate was heated and dried in an oven at 100° C. for 4 hours to prepare a red color conversion filter F-1 to be used as the color conversion member according to the invention.

A green color conversion filter F-2 coated with GL-10 and a blue color conversion filter F-3 coated with BL-3 were prepared in the same manner as in F-1.

Then a stripe of the blue color conversion filter F-3 was pasted on the lower side of the transparent substrate of the transparent resin film. The organic EL element of this example had the following structure.

Color conversion member/Transparent substrate/Dielectric mirror/Transparent electrode/Organic compound thin layer/Metal electrode Thus an organic electroluminescent element having the micro optical resonator was prepared.

Clear blue light was emitted when voltage of 8 V was applied to the element. The maximum peak in the spectrum of the emitted light was at 448 nm and the position on the CIE coordinate was (0.15, 0.06).

Organic electroluminescent elements were prepared in the same manner as in the above-mentioned except that in each of which the blue color conversion filter F-3 was replaced by the green color conversion filter F-2 and red color conversion filter F-1, respectively. Green light with the maximum emission wavelength of 532 nm and (0.24, 0.63) on the CIE coordinate and red light with the maximum emission wavelength of 615 nm and (0.63, 0.33) on the CIE coordinate were emitted from the element having the green color filter F-2 and that having the red color filter F-1, respectively.

Moreover, an organic EL element having the following layer construction was prepared by changing the position of the color conversion member to the upper side of the transparent substrate.

Transparent substrate/Color conversion member/Dielectric mirror/Transparent electrode/Organic Compound thin layer/Metal electrode In such the case, the spectra almost the same as those of the blue, green and red light from the foregoing organic EL elements in the maximum emission wavelength and the position on the CIE coordinate were obtained.

The similar results were obtained when the transparent substrate was changed to that prepared in Example 1-2.

Comparative example 1

A transparent substrate having the dielectric structure was prepared in the same manner as in Example 1 except that the thickness of the $SiO_2$ layer and the $TiO_2$ layer were each changed to 79 nm and 48 nm, respectively.

A transparent electrically-conductive layer ITO with a thickness of 50 nm was formed by the RF-magnetron spattering method on the thus obtained transparent substrate having the dielectric mirror. The substrate was sufficiently washed and fixed in the vacuum deposition apparatus. Then an m-MTDATA layer with a thickness of 40 nm as the hole transporting layer, a layer of DPVBi with a thickness of 25 nm as a light-emitting layer and an $Alq_3$ layer with a thickness of 10 nm were deposited. Then the total thickness of the transparent electrically-conductive layer and the organic compound thin layers was become 125 nm.

The structures of m-MTDATA, DPVBi and Alq$_3$ are shown below.

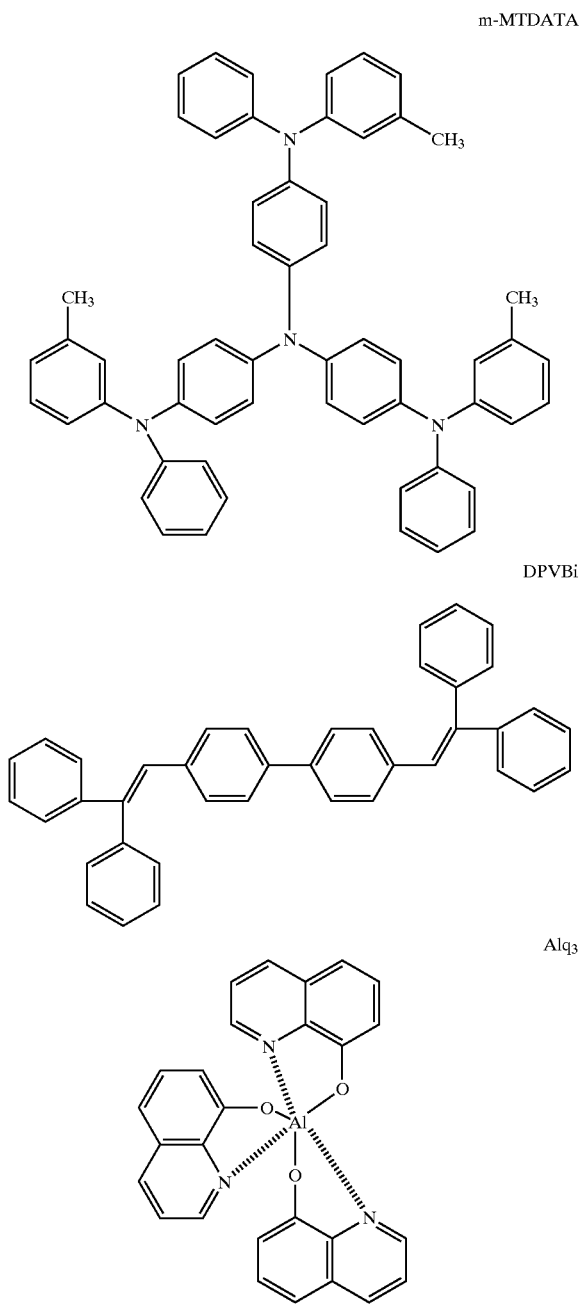

m-MTDATA

DPVBi

Alq$_3$

The optical length of the micro optical resonator in the thus obtained element was 1.5 times of the objective wavelength of 460 nm according to the foregoing Equation 1 based on the thickness and the refractive index of the transparent electrically-conductive layer and the organic compound layers and the light penetration deepness into the dielectric mirror. A layer of the MgAg alloy layer with a thickness of 180 nm was deposited at the last.

<Preparation of Color Conversion Member Using Organic Fluorescent Substance>

A color conversion member using an organic fluorescent substance was prepared according to the description of JP O.P.I. No. 3-152897. In concrete, a layer of coumarin 153 dispersed in polymethacrylate (PMMA) was used in the green color conversion member, and a layer of phenoxadine 9 and pyridine 1 dispersed in polymethacrylate (PMMA) was used in the red color conversion member. Coumarin 153, phenoxadine 9 and pyridine 1 were described in the foregoing publication.

A stripe of the green color conversion member was pasted on the lower side of the transparent substrate of the transparent resin film. Green light was emitted when voltage of 8 V was applied to the element. The maximum peak in the spectrum of the emitted light was at 532 nm and the position on the CIE coordinate was (0.24, 0.63).

An organic EL element was prepared by replacing the above green color conversion member by the red color conversion member. Red light was emitted when voltage of 8 V was applied to the element. The maximum peak in the spectrum of the emitted light was at 615 nm and the position on the CIE coordinate was (0.63, 0.32).

As above-mentioned, the organic electroluminescent elements having the micro optical resonator were prepared. The brightness of the green and red light were either lower than that of the light obtained in Example 2 in which the light emitted from the light-emitting layer was bluish purple. In the case of this comparative example, the wide visual angle cannot be obtained because of that the color conversion member is not necessary the organic electroluminescent element having the micro optical resonator for blue light since the light from the light-emitting layer is blue. Accordingly, a problem that the element was difficultly produced was raised.

Comparative Example 2-1

An organic electroluminescent element in the same manner as in Example 2 except that the process for forming the dielectric mirror by stacking the three SiO$_2$ layers and the three TiO$_2$ layers was omitted. The layer construction of this comparative example is as follows.

Color conversion member/Transparent substrate/Transparent electrode/Organic compound thin layer/Metal electrode.

The intensities of the blue, green and red light emitted from this element were each 0.27, 0.33 and 0.24 times of those obtained in Example 2, respectively.

Comparative Example 2-2

An organic electroluminescent element was prepared in the same manner as in Comparative example 1 except that the process for forming the dielectric mirror by stacking the three SiO$_2$ layers and the three TiO$_2$ layers was omitted. The layer construction of this comparative example is as follows.

Color conversion member/Transparent substrate/Transparent electrode/organic compound thin layer/Metal electrode.

The intensities of the green and red light emitted from this element were each 0.40 and 0.33 times of those obtained in Example 2, respectively. It was found that the intensifying effect on the intensity of the emitted light in the case of conversion of blue light from the organic EL member is lower than that in the case of conversion bluish purple light emitted from the organic EL member.

Comparative Example 2-3

An organic electroluminescent element was prepared in the same manner as in Example 2 except that the process for forming the color conversion member was omitted. Bluish purple light was emitted from this element. The spectrum of the light shows the maximum emission wavelength of 405 nm and the half band width of 12 nm, and the CIE coordinate of x=0.16 and y=0.036. However, the light emission pattern was not suitable for a displaying apparatus since suitable visible angle cannot be obtained.

Example 3

An example of the displaying apparatus of the invention using the organic EL element according to the invention prepared in Example 2 is described below according to the drawings.

FIG. 1 is a schematic drawing of a displaying apparatus such as a display of a portable telephone, which displays image information by light emitted from the organic EL element.

The display 1 comprises display A having a plurality of pixel and a controlling block B imagewise scanning the display A according to image information.

The controlling block B electrically connected with the display A transmits a scanning signal and an image information signal according to external image information to each of the plural pixels 3. The pixels on each the scanning line sequentially lights corresponding to the image date signal for scanning. Thus the image information is displayed on the display A.

Figure 2:
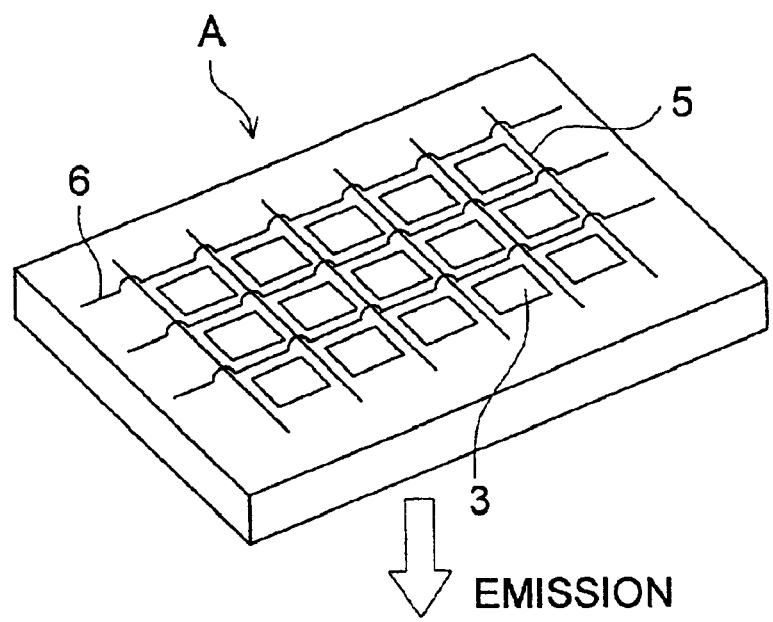
FIG. 2 shows a schematic drawing of a display.

FIG. 2 is a schematic drawing of the display A.

The display A has a wiring portion including a scanning signal line 5 and a data signal line 6, and a plurality of pixel 3. Principal members of the display A are described below.

In the case of the drawing, the emitted light is output in the direction of the white arrow or the lower side.

The scanning signal lines 5 and the data signal lines 6 are each composed of an electroconductive material and each of the line 5 and the line 6 are crossed with each other at right angles and connected with the pixel 3 at the crossing point. The detail of the structure is not shown in the drawing.

The pixel 3 receives the image data from the data signal line and emits light corresponding to the image data when the canning signal is applied form the scanning signal line 5. A full color image can be displayed by suitably arranging the red-light emitting pixel, green-light emitting pixel and blue-light emitting pixel on the same substrate.

The light emitting process of the pixel 3 is described below.

Figure 3:
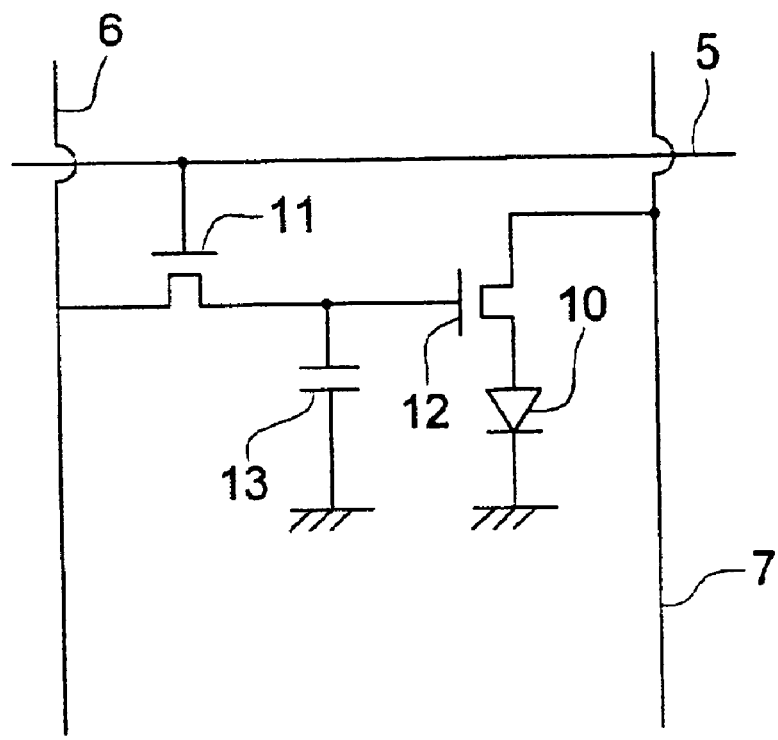
FIG. 3 shows a schematic drawing of a pixel.

FIG. 3 is a schematic drawing of the pixel 3.

The pixel 3 has an organic EL element 10, a switching transistor 11, a driving transistor 12 and a condenser 13.

In the drawing, the image data signal was applied to the drain of the switching transistor 11 from the controlling block B through the data signal line 6. The drive of the switching transistor is turned on when the scanning signal is applied to the gate of the switching transistor 11 from the controlling block B through the scanning signal line 5 so that the image data signal applied to the drain is transmitted to the condenser 13 and the gate of the driving transistor 12.

When the image data signal is transmitted, the condenser 13 is charged corresponding to the potential of the image data signal, and the drive of the driving transistor 12 is turned on. The drain of the driving transistor 12 is connected to a power line 7 at and the source of the transistor is connected to the electrode of the organic EL element 10. An electric current is supplied from the power line 7 to the organic EL element 10 corresponding to the potential of the image information signal applying to the gate.

The drive of the transistor 11 is turned off when the scanning signal is moved to the next scanning signal line 5 according to the sequential scanning by the controlling block B. However, the drive of the driving transistor 12 is held at the "on" status so as to continue the light emission of the organic EL element 10 until the next scanning signal is applied since the condenser 13 maintains the potential charged by the image data signal even when the drive of the transistor is turned off. When the next scanning signal is applied by the sequential scanning, the driving transistor 12 is driven according to the potential of the next image data signal synchronized with the scanning signal so that the organic EL element 10 emits light.

Namely, the light emission of the organic EL element 10 of each of the plural pixels 3 is performed by providing the switching transistor 11 as an active element and the driving transistor 12 to the organic EL element of the each of the plural pixels 3. Such the light emission system is called as the active matrix system.

The light emission of the organic EL element 10 may be either the emission of light with gradation according to a multi-value image data signal having plural gradation potential or on-off emission of a prescribed amount of light according to a binary image data signal.

The potential maintained by the condenser 13 may be held until the application of the next scanning signal or discharged just before the application of the next scanning signal.

In the invention, the light emission may be driven by a passive matrix system in which the organic EL element emits light according to the data signal only at the time of arriving of the scanning signal, not limited to the foregoing active matrix system.

Figure 4:
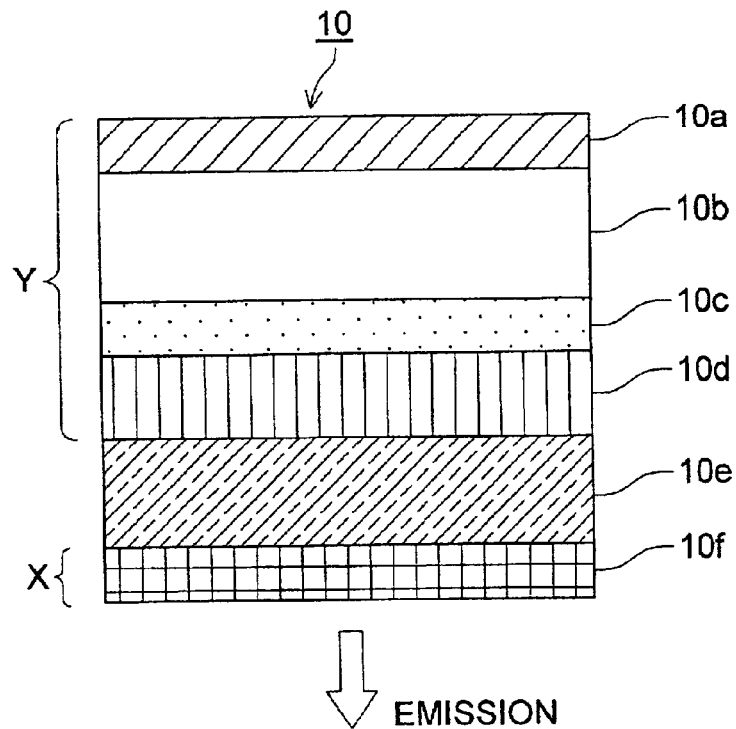
FIGS. 4(a) and 4(b) show cross-sections
Figure 4:
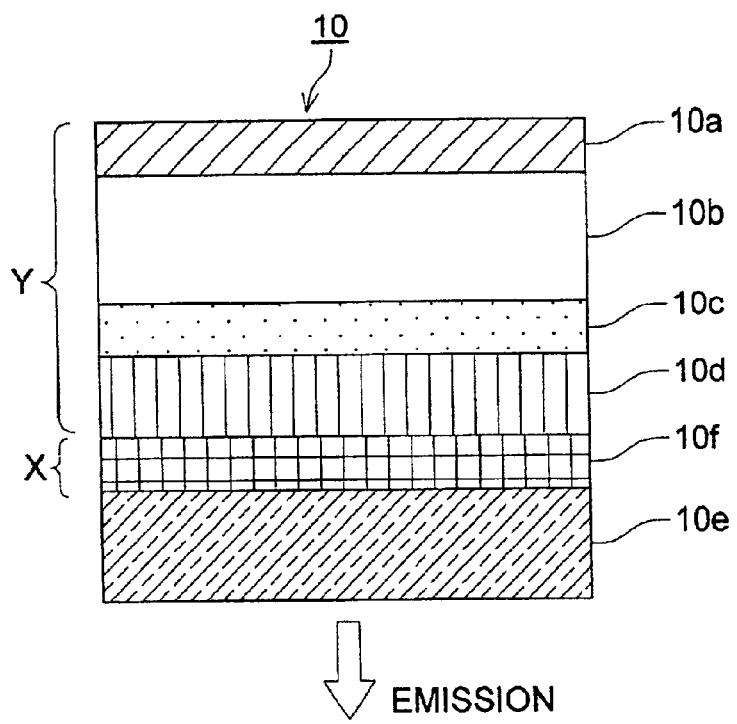

FIG. 4 shows a cross section from the thickness direction of the part of the organic EL element 10 of the pixel 3.

FIGS. 4a and 4b are each shows different embodiments in which the arrangement of the color conversion member is different from each other. In the embodiment of the organic EL element 10 shown in FIG. 4a, the organic EL member Y and the color conversion member X are each provided on the upper and the lower side of a transparent resin film 10e as the transparent substrate, respectively. In the embodiment of the organic EL element 10 shown in FIG. 4b, the organic EL member Y and the color conversion member X are stacked on the upper side of a transparent resin film 10e in this order.

In the drawings, 10a is the metal electrode, lob is the organic compound thin layer including the light-emitting layer, 10c is the transparent electrode, 10d is the dielectric mirror, 10e is the transparent resin film, and 10f is the color conversion layer.

Light is emitted corresponding to the current when the current is supplied to the organic compound thin layer lob through the metal electrode 10a and the transparent electrode 10c. In the invention, the color of the light is preferably within the region of bluish purple. The emitted light of the bluish purple region is intensified between the dielectric mirror 10d and the metal electrode 10a as the reflecting member and output as high intensity light directed to the lower side in the drawing. The output light is absorbed by the color conversion layer through or not through the transparent resin film 10e, and the light of red region, green region and blue region each can be respectively output in the direction of the white arrow in the drawing according to the red, green and blue conversion ability of the color conversion layer.

Figure 5:
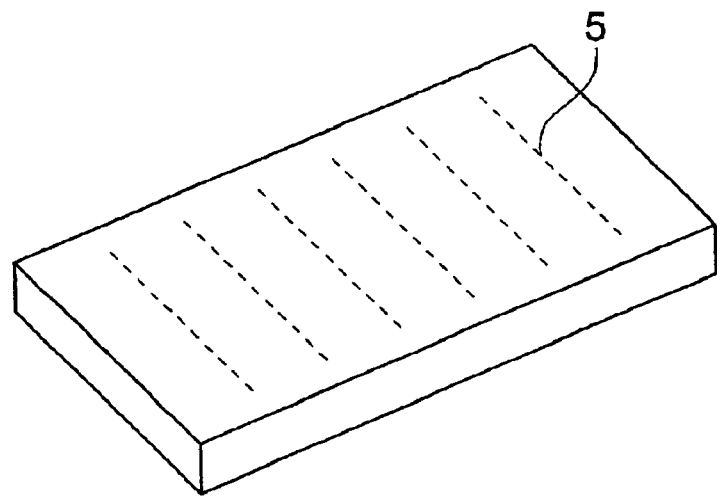
FIG. 5 shows a schematic drawing of a passive matrix displaying apparatus.
Figure 5:
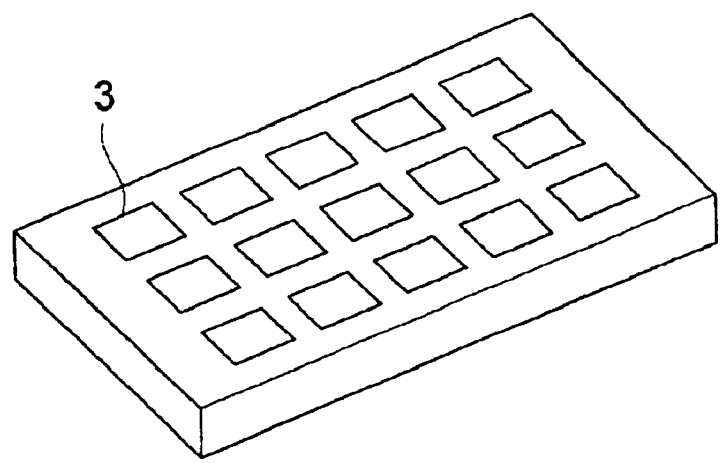
Figure 5:
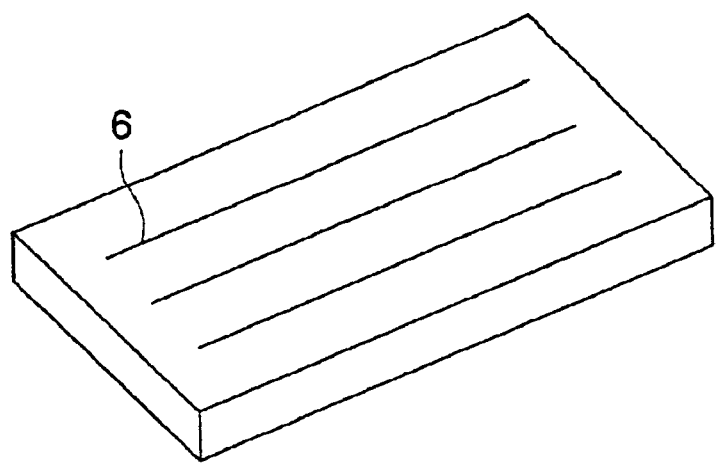

FIG. 5 shows a schematic drawing of a display A by the passive matrix system. In the drawing, the plural scanning lines 5 and the plural image data signal lines 6 are faced in a grid shape through the pixel 3.

When the scanning signal is applied from the scanning signal line 5 by the sequential scanning, the pixel 3 connected to the line 5 to which the scanning signal is applied emits light corresponding to the image data signal.

In the passive matrix system, the producing cost of the apparatus can be reduced since the pixel 3 of the apparatus has no active element.

An organic EL element having a high light emitting efficiency, a wide visible angle and that without a color change depending on the viewing angle, a light emission method of such the element, a displaying apparatus and its displaying method and a transparent substrate having a suitability for the portable apparatus, a low moisture permeability and applicable to the organic EL element can be provided by the invention.

What is claimed is:

1. An organic electroluminescent element having a micro optical resonator structure, an organic electroluminescent member emitting light within the color region of bluish purple having a maximum peak of spectrum of from 350 nm to 420 nm and a color conversion member emitting visible fluorescent by absorbing the light emitted from the organic light emitting member, wherein the color of the light emitted from the color conversion member is within the red region, and the color conversion member is selected from a group consisting of $K_5Eu_{2.5}(WO_4)_{6.25}$, $Na_5Eu_{2.5}F(WO_4)_{6.25}$, $K_5Eu_{2.5}F(MoO_4)_{5.25}$, and $Na5Eu_{2.5}F(MoO_4)_{6.25}$.

2. The organic electroluminescent element of claim 1, wherein the organic electroluminescent member is provided on the upper side of a transparent substrate and has a half mirror member, an organic compound layer containing a light-emitting layer and a light reflective member in this order from the transparent substrate.

3. The organic electroluminescent element of claim 2, wherein the light reflective member is a metal electrode.

4. The organic electroluminescent element of claim 2, wherein the transparent substrate is a transparent resin film.

5. The organic electroluminescent element of claim 2, wherein the half mirror has a dielectric mirror and a transparent electrode in this order from the transparent substrate.

6. The organic electroluminescent element of claim 5, wherein the color conversion member is provided under the dielectric mirror.

7. The organic electroluminescent element of claim 5, wherein the dielectric mirror comprises a layer mainly comprising silicon oxide and a layer mainly comprising titanium oxide.

8. The organic electroluminescent element of claim 7 wherein at least one of the layer mainly comprising silicon oxide and the layer mainly comprising titanium oxide contains silicon oxonitride or titanium oxonitride.

9. The organic electroluminescent element of claim 8, wherein the layer has structure of slacked layers each different in the refractive index from each other.

10. The organic electroluminescent element of claim 1, wherein the color of the light emitted from the color conversion member is within the red region.

11. A displaying apparatus wherein a first organic electroluminescent element, a second organic electroluminescent element and a third organic electroluminescent element are arranged in a line on the same substrate; and wherein said first organic electroluminescent element is an organic electroluminescent element of claim 10;

said second organic electroluminescent element is an organic electroluminescent element having a micro optical resonator structure, an organic electroluminescent member emitting light within the color region of bluish purple and a color conversion member emitting visible fluorescent by absorbing the light emitted from the organic light emitting member, and wherein the color of the light emitted from the color conversion member is within the green region; and said third organic electroluminescent element is an organic electroluminescent element having a micro optical resonator structure, an organic electroluminescent member emitting light within the color region of bluish purple and a color conversion member emitting visible fluorescent by absorbing the light emitted from the organic light emitting member, and wherein the color of the light emitted from the color conversion member is within the blue region.

12. The organic electroluminescent element of claim 1, wherein the color of the light emitted from the color conversion member is within the green region.

13. The organic electroluminescent element of claim 1, wherein the color of the light emitted from the color conversion member is within the blue region.

14. A displaying apparatus having the organic electroluminescent element of claim 1.

15. The organic electroluminescent element of claim 1, which further comprises a transparent substrate having a dielectric mirror structure.

16. The organic electroluminescent element of claim 15, wherein the dielectric mirror layer is provided on the upper side of the transparent substrate.

17. The organic electroluminescent element of claim 15, wherein the transparent substrate is a transparent resin film.

18. The organic electroluminescent element of claim 15, wherein the dielectric mirror structure comprises a dielectric mirror layer mainly comprising silicon oxide and a layer mainly comprising titanium oxide.

19. The organic electroluminescent element of claim 15, wherein the transparent substrate comprises a color conversion member provided between a transparent resin film and a dielectric mirror layer.

20. The organic electroluminescent element of claim 15, wherein the transparent substrate comprises at least one of a layer comprising silicon oxide and the layer mainly comprising titanium oxide contains silicon oxonitride or titanium oxonitride.

21. A method for emitting light wherein visible fluorescent light is emitted from a color converting member by absorbing light within the bluish purple region with a maximum peak of spectrum of from 350 nm to 420 nm emitted from an organic electroluminescent light emission member having a micro optical resonator structure, wherein the color of the light emitted from the color conversion member is within the red region, and the color conversion member is selected from a group consisting of $K_5Eu_{2.5}(WO_4)_{6.25}$, $Na_5Eu_{2.5}F(WO_4)_{6.25}$, $K_5Eu_{2.5}F(MoO_4)_{6.25}$, and $Na5Eu_{2.5}F(MoO_4)_{6.25}$.

22. The method for emitting light of claim 21 wherein the color of the light emitted from the color Conversion member is within the green region.

23. The method for emitting light of claim 21 wherein the color of the light emitted from the color conversion member is within the blue region.

24. A method for displaying wherein displaying is performed by the light emitted by the method of claim 21.

25. A method for displaying wherein full color displaying is performed by the use of the light within the red region is emitted by the method for emitting light of claim 21, the light within the green region is emitted by the method for emitting light wherein visible fluorescent light is emitted from a color converting member by absorbing light within the bluish purple region emitted from an organic electroluminescent light emission member having a micro optical resonator and wherein the color of the light emitted from the color conversion member is within the green region, and the light within the blue region is emitted by the method for emitting light wherein visible fluorescent light is emitted from a color converting member by absorbing light within the bluish purple region emitted from an organic electroluminescent light emission member having a micro optical resonator structure and wherein the color of the light emitted from the color conversion member is within the blue region.

* * * * *